United States Patent
Nishimoto et al.

(10) Patent No.: US 7,005,382 B2
(45) Date of Patent: Feb. 28, 2006

(54) AQUEOUS DISPERSION FOR CHEMICAL MECHANICAL POLISHING, CHEMICAL MECHANICAL POLISHING PROCESS, PRODUCTION PROCESS OF SEMICONDUCTOR DEVICE AND MATERIAL FOR PREPARING AN AQUEOUS DISPERSION FOR CHEMICAL MECHANICAL POLISHING

(75) Inventors: Kazuo Nishimoto, Tokyo (JP); Tatsuaki Sakano, Tokyo (JP); Akihiro Takemura, Tokyo (JP); Masayuki Hattori, Tokyo (JP); Nobuo Kawahashi, Tokyo (JP); Naoto Miyashita, Yokohama (JP); Atsushi Shigeta, Fujisawa (JP); Yoshitaka Matsui, Yokohama (JP); Kazuhiko Ida, Yokohama (JP)

(73) Assignees: JSR Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 25 days.

(21) Appl. No.: 10/694,890

(22) Filed: Oct. 29, 2003

(65) Prior Publication Data

US 2004/0132305 A1    Jul. 8, 2004

(30) Foreign Application Priority Data

Oct. 31, 2002  (JP)  .............................. 2002-318643
Mar. 3, 2003   (JP)  .............................. 2003-056093

(51) Int. Cl.
  *B24B 1/00*  (2006.01)
(52) U.S. Cl. .................. 438/690; 51/307; 51/308; 51/309; 106/3; 438/692; 438/693; 257/E21.23; 257/E21.304
(58) Field of Classification Search ................. 51/307, 51/308, 309; 106/3; 438/690, 692, 693; 257/E21.23, E21.304
  See application file for complete search history.

(56) References Cited

U.S. PATENT DOCUMENTS

| | | |
|---|---|---|
| 4,588,421 A | 5/1986 | Payne |
| 6,354,913 B1 | 3/2002 | Miyashita et al. |
| 6,530,968 B1 * | 3/2003 | Tsuchiya et al. ............ 51/307 |
| 6,702,954 B1 * | 3/2004 | Her et al. .................. 252/79.1 |
| 2002/0004268 A1 * | 1/2002 | Lin et al. ..................... 438/221 |
| 2004/0134873 A1 * | 7/2004 | Yao et al. ....................... 216/2 |

FOREIGN PATENT DOCUMENTS

| | | |
|---|---|---|
| EP | 0 520 109 A1 | 12/1992 |
| EP | 0 853 335 A2 | 7/1998 |
| EP | 0 896 042 A1 | 2/1999 |
| EP | 0 967 260 A1 | 12/1999 |
| EP | 1 077 241 A2 | 2/2001 |
| JP | 61-38954 | 2/1986 |
| JP | 62-30333 | 2/1987 |
| JP | 5-67600 | 3/1993 |
| JP | 9-63996 | 3/1997 |
| JP | 9-186237 | 7/1997 |
| JP | 10-309660 | 11/1998 |
| JP | 10-321569 | 12/1998 |
| JP | 11-265862 | 9/1999 |
| JP | 11-302633 | 11/1999 |
| JP | 2001-77060 | 3/2001 |
| JP | 2001-523394 | 11/2001 |
| WO | WO 96/38262 | 12/1996 |
| WO | WO 01/78116 A2 | 10/2001 |
| WO | WO 02/31072 A1 | 4/2002 |

* cited by examiner

*Primary Examiner*—Michael Marcheschi
(74) *Attorney, Agent, or Firm*—Oblon, Spivak, McClelland, Maier & Neustadt, P.C.

(57) ABSTRACT

Provided are an aqueous dispersion for chemical mechanical polishing, which planarizes a surface to be polished and has high shelf stability, a chemical mechanical polishing process excellent in selectivity when surfaces of different materials are polished, and a production process of a semiconductor device. A first aqueous dispersion contains a water-soluble quaternary ammonium salt, an inorganic acid salt, abrasive grains and an aqueous medium. A second aqueous dispersion contains at least a water-soluble quaternary ammonium salt, another basic organic compound other than the water-soluble quaternary ammonium salt, an inorganic acid salt, a water-soluble polymer, abrasive grains and an aqueous medium. The second aqueous dispersion is composed of a first aqueous dispersion material (I) obtained by mixing a water-soluble quaternary ammonium salt and an inorganic acid salt into an aqueous medium, and a second aqueous dispersion material (II) obtained by mixing a water-soluble polymer and another basic organic compound other than the water-soluble quaternary ammonium salt into an aqueous medium. Abrasive grains are contained in at least one of the aqueous dispersion materials.

8 Claims, No Drawings

AQUEOUS DISPERSION FOR CHEMICAL MECHANICAL POLISHING, CHEMICAL MECHANICAL POLISHING PROCESS, PRODUCTION PROCESS OF SEMICONDUCTOR DEVICE AND MATERIAL FOR PREPARING AN AQUEOUS DISPERSION FOR CHEMICAL MECHANICAL POLISHING

BACKGROUND OF THE INVENTION

1. Field of the Invention

The present invention relates to an aqueous dispersion for chemical mechanical polishing and a chemical mechanical polishing process making use of this dispersion. Further, the present invention relates particularly to an aqueous dispersion for chemical mechanical polishing that has high shelf stability, prevents deterioration with time even in storage in a state of a high concentration, can provide a polished surface having excellent planarization and lessened surface defects by chemical mechanical polishing and is useful in production of semiconductor devices, a chemical mechanical polishing process excellent in polishing and removal selectivity making use of such a dispersion, and a production process of semiconductor devices.

2. Description of the Background Art

With the increase of the degree of integration and the formation of multi-layer wiring in semiconductor devices, a technique of chemical mechanical polishing is adopted for polishing of a film to be processed. This technique serves to remove an excess wiring material and form a wiring by embedding a proper wiring material in grooves, holes or the like of a desired pattern formed in a dielectrics on a process wafer and then chemically and mechanically polishing the dielectrics.

Such a chemical mechanical polishing process is also applied to formation of capacitors, gate electrodes and the like in addition to the formation of wiring and utilized in specular polishing of a silicon wafer such as an SOI (silicon on insulator) substrate.

Objects to be polished by such a chemical mechanical polishing process include various films such as polysilicon films (polycrystalline silicon films), monocrystalline silicon films, silicon oxide films, aluminum films, tungsten films and copper films.

In such a chemical mechanical polishing step, the object should be naturally achieved by conducting polishing only for a standard time of X/V (min) when an initial excess film of thickness X (Å), formed by embeding a wiring material in grooves or the like is polished at a removal rate of V (Å/min). In an actual production step of semiconductor devices, however, over polishing exceeding the standard time, X/V (min) is carried out for the purpose of removing the wiring material remaining on other portions than the grooves or the like. "Dishing" that a portion of wiring becomes a concave form or "erosion" that a portion of alternate wiring obtained by alternately forming a wiring portion and an insulating portion becomes a concave form is caused by such over polishing. These phenomena are not preferred in that yield of semiconductor devices is lowered.

Further, surface defects including so-called "scratches" of abrased-like state, may be caused by polishing in some cases. This phenomenon may also lower yield of semiconductor devices like the dishing and erosion in some cases.

Various compositions such as aqueous dispersions for chemical mechanical polishing for restraining such dishing and erosion, aqueous dispersions for chemical mechanical polishing for restraining the surface defects such as scratches and aqueous dispersions for chemical mechanical polishing having both properties in combination have heretofore been proposed.

For example, it is disclosed that excellent surface planarizing ability can be achieved by polishing a silicon wafer using a composition containing silica and piperazine (Japanese Patent Application Laid-Open No. 154760/1993). However, piperazine that is an essential component of this disclosed composition is an objective substance to regulate the amount of discharge to environment, and so the use thereof becomes a problem from the viewpoints of safety and influence on the environment.

In addition, compositions for polishing comprising at least one abrasive grain selected from silicon dioxide, aluminum oxide, cerium oxide, titanium oxide, silicon nitride, zirconium oxide and manganese dioxide and water, and additionally containing a basic organic compound in a state dissolved are disclosed. It is described that by these compositions for polishing, a great removal rate is achieved, and occurrence of surface defects on a polished surface can be lessened (see, for example, Japanese Patent Application Laid-Open No. 321569/1998).

With requirement of the increase of the degree of integration and the micronization in semiconductor devices, the micronization of a wiring pitch and the formation of a thinner dielectrics make progress. By the micronization of the wiring pitch, a silicon oxide film and a stopper layer composed of a nitride such as silicon nitride or titanium nitride are also made fine. When the stopper layer is over polished, however, the intended function of the stopper layer cannot be fulfilled, and erosion or the like are caused, so that the function as a semiconductor substrate may be impaired in some cases.

In addition, the surface defects including scratches on a polished surface have such influence that electrical properties of a dielectrics deposited thereon are deteriorated, and this influence becomes greater by the formation of a thinner dielectrics.

When a surface to be polished having the above-described stopper layer is polished with such a composition for polishing as described above, it is not easy to achieve both improvement of polishing and removal selectivity as to the layer to be polished and the stopper layer, and lessening of surface defects including scratches.

The term, "polishing and removal selectivity" as used herein means properties that a high rate of polishing and removal is achieved as to a material to be polished, while the rate of polishing and removal is low as to other materials, and means properties that when a surface to be polished composed of, for example, at least 2 material is polished, only one material to be polished can be polished with high efficiency without over polishing other materials to be polished. More specifically, the term, "polishing and removal selectivity as to a layer to be polished and a stopper layer" means properties that only the layer to be polished can be polished with high efficiency without over polishing the stopper layer when both layer to be polished and stopper layer are polished at the same time.

In order to solve the above-described problem, there have been proposed compositions improved in the polishing and removal selectivity as to a polysilicon film and a silicon oxide film and compositions controlled in removal rate (hereinafter also referred to as "polishing rate") of polishing a nitride.

For example, Japanese Patent Application Laid-Open No. 321569/1998 discloses that the polishing rate of a silicon oxide film can be controlled by the above-described composition for polishing to increase the polishing and removal selectivity as to a polysilicon film and the silicon oxide film. However, it is not investigated to control the polishing rate of a nitride.

A composition for polishing comprising a tetramethylammonium salt, a base and hydrogen peroxide in combination is also disclosed. It is described that by this composition, the polishing rate of a nitride can be controlled to increase the polishing and removal selectivity as to both oxide and nitride (for example, Japanese Patent Application Laid-Open No. 270401/1998). However, this composition is excellent in the polishing and removal selectivity as to both oxide and nitride, but the polishing and removal selectivity as to polysilicon that becomes a material of a gate electrode and a nitride and the polishing and removal selectivity as to polysilicon and silicon oxide are not investigated.

With respect to the above-described composition for polishing, in particular, long-term stability in a high-concentration state that concentrations of respective components are higher than those in a polishing applicable state to be actually served for polishing is also not investigated, and the composition is assumed to be used within several hours after preparation of the composition. Therefore, this composition involves factors that cost is increased upon actual use, such as need of transporting and storing it in a state that the concentrations of the components has been controlled as low as those upon its use.

SUMMARY OF THE INVENTION

The present invention has been made on the basis of the foregoing circumstances and has as its first object the provision of an aqueous dispersion for chemical mechanical polishing, which is excellent in surface planarizing ability as dishing, erosion or the like is lessened in a plarnarizing step of a surface to be polished by chemical mechanical polishing, excellent in polishing and removal selectivity as to polysilicon and silicon oxide and polishing and removal selectivity as to polysilicon and a nitride, and excellent in long-term stability even in a high-concentration state, a chemical mechanical polishing process using this composition, and a production process of a semiconductor device.

It is the second object of the present invention to provide an aqueous dispersion for chemical mechanical polishing, by which dishing, erosion or surface defects including scratches are restrained in a plarnarizing step of a surface to be polished by chemical mechanical polishing, and which is excellent in polishing and removal selectivity as to polysilicon and silicon oxide and polishing and removal selectivity as to polysilicon and a nitride, and excellent in long-term stability even in a high-concentration state, a chemical mechanical polishing process using this composition, and a production process of a semiconductor device.

According to the present invention, there is thus provided a first aqueous dispersion (hereinafter also referred to as "first slurry") for chemical mechanical polishing obtained by mixing a water-soluble quaternary ammonium salt, an inorganic acid salt and abrasive grains into an aqueous medium.

According to the present invention, there is also provided a second aqueous dispersion (hereinafter also referred to as "second slurry") for chemical mechanical polishing obtained by mixing at least a water-soluble quaternary ammonium salt, another basic organic compound other than the water-soluble quaternary ammonium salt, an inorganic acid salt, a water-soluble polymer and abrasive grains into an aqueous medium.

According to the present invention, there is further provided a material for preparing an aqueous dispersion for chemical mechanical polishing, comprising a first aqueous dispersion material (I) obtained by mixing at least a water-soluble quaternary ammonium salt and an inorganic acid salt into an aqueous medium, and a second aqueous dispersion material (II) obtained by mixing at least a water-soluble polymer and another basic organic compound other than the water-soluble quaternary ammonium salt into an aqueous medium, wherein abrasive grains are mixed into at least one of the first aqueous dispersion material (I) and the second aqueous dispersion material (II), and the aqueous dispersion for chemical mechanical polishing is prepared by both of the first aqueous dispersion material (I) and the second aqueous dispersion material (II).

According to the present invention, there is still further provided a chemical mechanical polishing process comprising the step of polishing a surface to be polished with any of the aqueous dispersions for chemical mechanical polishing described above.

The chemical mechanical polishing process may further comprises the step of polishing the surface to be polished with another aqueous dispersion for chemical mechanical polishing than the above aqueous dispersion for chemical mechanical polishing.

According to the present invention, there is yet still further provided a process for producing a semiconductor device wherein the semiconductor device is produced by conducting the step of polishing a surface to be polished on a semiconductor substrate with any of the aqueous dispersions for chemical mechanical polishing described above.

DETAILED DESCRIPTION OF THE PREFERRED EMBODIMENTS

The aqueous dispersions (hereinafter also referred to as "slurries" merely) for chemical mechanical polishing according to the present invention will hereinafter be described.

According to the present invention, there are fundamentally provided the first slurry and the second slurry.

<First Slurry>

The first slurry is obtained by mixing a water-soluble quaternary ammonium salt, an inorganic acid salt and abrasive grains into an aqueous medium.

The respective components making up the first slurry will hereinafter be described in detail.

The first slurry can be stored over a long period of time in a high-concentration state as described below. However, the preferred mixing proportions (hereinafter also referred to as "specific mixing proportions") of the respective components described below are all values in a polishing applicable state to be served for polishing.

[1] Water-Soluble Quaternary Ammonium Salt:

The water-soluble quaternary ammonium salt is preferably a compound represented by the following formula (1):

wherein R is an alkyl group having 1 to 4 carbon atoms.

Incidentally, 4 R groups may be the same or different from one another.

Specific examples thereof include compounds such as tetramethylammonium hydroxide, tetraethylammonium hydroxide, tetrapropylammonium hydroxide, tetraisopropylammonium hydroxide, tetrabutylammonium hydroxide and tetraisobutylammonium hydroxide. Among these, tetramethylammonium hydroxide and tetraethylammonium hydroxide are particularly preferred.

The above-mentioned water-soluble quaternary ammonium salts may be used either singly or in any combination thereof.

The mixing proportion of the water-soluble quaternary ammonium salt is preferably 0.005 to 5% by mass, more preferably 0.008 to 4% by mass, particularly preferably 0.01 to 3% by mass based on the total mass of the first slurry. If the mixing proportion of the water-soluble quaternary ammonium salt is lower than 0.005% by mass, a sufficient polishing rate may not be achieved in some cases. It is not necessary to contain the water-soluble quaternary ammonium salt in a proportion exceeding 5% by mass.

Incidentally, the water-soluble quaternary ammonium salt is dissolved in the resulting aqueous dispersion for chemical mechanical polishing, and a part thereof is contained as an ion.

[2] Inorganic Acid Salt:

Examples of the inorganic acid salt include the sodium salts, potassium salts, ammonium salts of inorganic acids such as hydrochloric acid, nitric acid, sulfuric acid, carbonic acid and phosphoric acid; and sodium salts, potassium salts and ammonium salts having a hydrogensulfate ion, hydrogencarbonate ion or hydrogenphosphate ion. Among these, ammonium salts are preferred, with ammonium carbonate, ammonium nitrate and ammonium sulfate being particularly preferred. These inorganic acid salts may be used either singly or in any combination thereof.

The mixing proportion of the inorganic acid salt is preferably 0.005 to 5% by mass, more preferably 0.008 to 4% by mass, particularly preferably 0.01 to 3% by mass based on the total mass of the first slurry.

If the mixing proportion of the inorganic acid salt is lower than 0.005% by mass, the effect of controlling dishing and erosion, namely, the effect of lessening dishing and erosion may become insufficient in some cases. It is not necessary to contain the inorganic acid salt in a proportion exceeding 5% by mass.

[3] Abrasive Grains:

The abrasive grains include inorganic particles, organic particles and composite particles.

As examples of the inorganic particles, may be mentioned particles of silicon dioxide, aluminum oxide, cerium oxide, titanium oxide, zirconium oxide, silicon nitride, manganese dioxide and the like. Among these, particles of silicon dioxide are preferred.

As specific examples of the silicon oxide particles, may be mentioned fumed silica synthesized by a fumed process, in which silicon chloride or the like is reacted with oxygen and hydrogen in a vapor phase, colloidal silica synthesized by a sol-gel process, in which a metal alkoxide is hydrolyzed and condensed, and colloidal silica synthesized by an inorganic colloid process, in which impurities are removed by purification.

The colloidal silica synthesized by the sol-gel process or colloid process is present in a state that primary particles have associated or aggregated in an aqueous medium, i.e., in a state of secondary particles, when the particle diameter thereof is relatively small. The inorganic particles in such a state preferably have an average particle diameter of 1 to 3,000 nm, more preferably 2 to 1,000 nm in terms of primary particles.

The average particle diameter of the secondary particles is preferably 5 to 5,000 nm, more preferably 5 to 3,000 nm, particularly preferably 10 to 1,000 nm. If inorganic particles, the average particle diameter of the secondary particles of which is smaller than 5 nm, are used, the resulting aqueous dispersion for chemical mechanical polishing cannot achieve a sufficiently high polishing rate in some cases. On the other hand, with a slurry using inorganic particles, the average particle diameter of the secondary particles of which exceeds 5,000 nm, the prevention of dishing and erosion may become insufficient in some cases, and further, surface defects such as scratches may be liable to occur.

The average particle diameter of the primary particles can be calculated out from the measurement of the specific surface area of the intended particles and observation through a transmission type electron microscope, and the like. The average particle diameter of the secondary particles can be determined by measurement by means of a laser scattering diffraction measuring device, or the like.

On the other hand, inorganic particles such as silica synthesized by the fumed process are produced in the form of secondary particles, and it is very difficult to disperse them in a state of primary particles in an aqueous medium, and so such particles are present as secondary particles obtained by aggregation of primary particles. Accordingly, the inorganic particles formed of silica synthesized by the fumed process are sufficiently identified so far as the secondary particles thereof are defined.

In the inorganic particles such as silica synthesized by the fumed process, the average particle diameter of the secondary particles thereof are preferably 10 to 10,000 nm, more preferably 20 to 7,000 nm, particularly preferably 50 to 5,000 nm. By using the inorganic particles composed of fumed silica, the average particle diameter of the secondary particles of which falls within this range, there can be provided a slurry which can achieve a high polishing rate, sufficiently prevents dishing and erosion and is high in stability.

As examples of the organic particles, may be mentioned polymer particles respectively composed of (1) polystyrene and styrene copolymers, (2) (meth)acrylic polymer and (meth)acrylic copolymers such as polymethyl methacrylate, (3) polyvinyl chloride, polyacetal, saturated polyester, polyamide, polyimide, polycarbonate and phenoxy resins, and (4) polyolefins and olefin copolymers such as polyethylene, polypropylene, poly(1-butene) and poly(4-methyl-1-pentene), and besides other thermoplastic resins.

These organic particles can be prepared by a method of grinding a resin obtained by an emulsion polymerization process, suspension polymerization process, emulsion dispersion polymerization process, bulk polymerization process or the like, or other methods. The organic particles may also be particles of a copolymer having a crosslinked structure obtained by causing a crosslinkable monomer such as divinylbenzene or ethylene glycol dimethacrylate to coexist in the above-described polymerization process.

The organic particles are preferably particles of a resin selected from (1) polystyrene and styrene copolymers and (2) (meth)acrylic polymer and (meth)acrylic copolymers such as polymethyl methacrylate among the resin mentioned above, and their copolymers having a crosslinked structure.

In such organic particles as described above, almost all the particles thereof are generally present as simple particles in the slurry. The average particle diameter of these organic particles is preferably 10 to 5,000 nm, more preferably 15 to 3,000 nm, particularly preferably 20 to 1,000 nm. By using the organic particles having an average particle diameter within this range, there can be provided an aqueous dispersion for chemical mechanical polishing which can achieve a high polishing rate, sufficiently prevents dishing and erosion and is high in stability.

In the present invention, as specific examples of the composite particles, may be mentioned inorganic organic composite particles obtained by integrally combining organic particles with inorganic particles, and modified particles obtained by bonding a modifying substance to surfaces of organic particles.

The composite particles composed of the inorganic organic composite particles are those obtained by integrally combining organic particles with inorganic particles to the extent that these particles are not easily separated. No particular limitation is imposed on the kinds of these organic particles and inorganic particles. For example, the same organic particles and inorganic particles as mentioned above may be used.

No particular limitation is also imposed on the specific structure of the composite particles. For example, those obtained by combining the organic particles composed of polymer particles with the inorganic particles by a proper method are preferably used.

More specifically, particles in a state that organic particles and inorganic particles, polarity of zeta potential of which are different from each other, have been combined by electrostatic force in, for example, an aqueous medium may be used as the composite particles.

The zeta potential of the organic particles is often negative in the whole pH range or a wide pH range exclusive of a low pH range. In particular, organic particles composed of a polymer having a carboxyl group, sulfonic group or the like surely have a negative zeta potential, and organic particles composed of a polymer having an amino group or the like have a positive zeta potential in a specific pH range. On the other hand, the zeta potential of the inorganic particles have high dependency on pH, and some inorganic particles have an isoelectric point, at which a zeta potential is zero, at a characteristic pH. In such inorganic particles, the polarity of the zeta potential thereof is reversed above and below this point.

From the above-described fact, a specific kind of organic particles are combined with a specific kind of inorganic particles, and both particles are mixed in such a pH range that their zeta potentials become reverse polarities to each other, whereby inorganic organic composite particles in a state that such organic particles and inorganic particles have been integrally combined by electrostatic force can be obtained. Even when the zeta potentials of organic particles and inorganic particles mixed have the same polarity upon mixing, inorganic organic composite particles in a state that the organic particles and inorganic particles have been integrally combined can also be obtained by changing the pH after the mixing to create a state that the zeta potentials thereof become reverse polarities to each other.

In the present invention, the composite particles may be modified organic particles of a state that a proper modifying substance has been bonded to the surfaces of organic particle composed of, for example, polymer particles. As examples of the polymer particles, may be mentioned particles of polystyrene and polymethyl methacrylate. The polymer particles, to which the modifying substance has been bonded, can be obtained by, for example, a method in which a reactive material for modifying substance, such as an alkoxysilane, aluminum alkoxide or titanium alkoxide, is polycondensed in the presence of the polymer particles to form the modifying substance on the surfaces of the polymer particles.

When the material for the modifying substance is an alkoxysilane, modified organic particles of a state that the polymer particles having polysiloxane on the surfaces thereof can be obtained. When the material for the modifying substance is an aluminum alkoxide or titanium alkoxide on the other hand, modified organic particles having atomic group containing an aluminum or titanium atom can be obtained. In the method described above, the surfaces of the polymer particles may also be treated with a silane coupling agent or the like.

In the present invention, the composite particles may also be inorganic organic composite particles combined by bonding inorganic particles such as silica particles or alumina particles to the surfaces of organic particles composed of proper polymer particles. In this case, the inorganic particles may be bonded in a form physically held to a bonding component such as polysiloxane on the surfaces of the polymer particles or be chemically bonded by a functional group such as a hydroxyl group existing on the surfaces of the polymer particles.

Those of a state that the inorganic organic composite particles integrally bonded by electrostatic force as described above have been modified by a modifying substance by a polycondensation reaction of, for example, an alkoxysilane, aluminum alkoxide, titanium alkoxide or the like in the presence of such inorganic organic composite particles can also be used as the composite particles.

When the composite particles are composed of the inorganic organic composite particles, such composite particles exist in any of the following States (1) to (3) according to the particle diameters and component proportions of the respective organic particles and inorganic particles forming the composite particles or in a state where more than one of the states are present in combination.

State (1): a state that the inorganic particles have adhered as shell particles to the surfaces of core particles composed of the organic particles.

State (2): a state that the organic particles have adhered as shell particles to the surfaces of core particles composed of the inorganic particles.

State (3): a state that the organic particle and inorganic particles have aggregated to each other without forming a clear core-shell structure.

Among the above-described states, State (1) or (3) is preferred.

In each of States (1) to (3), the inorganic particles may be in any state of primary particles and secondary particles, or both particles may be mixed.

With respect to the component proportions of the inorganic particles and organic particles forming the inorganic organic composite particles, the proportion of the inorganic particles is preferably 1 to 2,000 parts by mass, more preferably 10 to 1,000 parts by mass per 100 parts by mass of the organic particles.

In the present invention, the average particle diameter of the composite particles is preferably 20 to 20,000 nm, more preferably 50 to 10,000 nm, particularly preferably 50 to 5,000 nm.

By containing the composite particles satisfying the above-described conditions, there can be provided a slurry which can achieve a high polishing rate, sufficiently prevents dishing and erosion and is high in stability.

The mixing proportion of the abrasive grains may be controlled to preferably 0.01 to 10% by mass, more preferably 0.03 to 8% by mass, particularly preferably 0.05 to 5% by mass based on the total mass of the first slurry. If the mixing proportion of the abrasive grains is lower than 0.01% by mass, the resulting slurry cannot achieve sufficient polishing rate. If the mixing proportion exceeds 10% by mass on the other hand, the resulting slurry becomes high cost and may be deteriorated in shelf stability in some cases.

[4] Aqueous Medium:

The first slurry is obtained by mixing the water-soluble quaternary ammonium salt, inorganic acid salt and abrasive grains as described above, and components optionally contained into an aqueous medium to disperse them in the aqueous medium. As the aqueous medium, may be used water, a mixed medium comprising water and a water-soluble alcohol in an amount or proportion within a range not impairing the polishing performance, or the like. However, water is particularly preferred.

[5] Other Components:

The first slurry is obtained by mixing the water-soluble quaternary ammonium salt, inorganic acid salt and abrasive grains into the aqueous medium as described above and may contain additives such as organic acids or salts thereof, oxidizing agents and/or surfactants as needed in addition to the above-described components. A water-soluble polymer may also be contained.

Specific examples of the organic acids include formic acid, acetic acid, propionic acid, p-toluenesulfonic acid, isoprenesulfonic acid, gluconic acid, lactic acid, citric acid, tartaric acid, malic acid, glycolic acid, adipic acid, malonic acid, oxalic acid, succinic acid, fumaric acid, maleic acid and phthalic acid, and besides alanine, glycine, aspartic acid and glycylglycine that are amino acids.

The salts of the organic acids include alkali metal salts such as potassium salts and ammonium salts of the above-mentioned organic acids.

These organic acids or the salts thereof may be used either singly or in any combination thereof. Alternatively, the organic acids and salts may be used in combination.

The mixing proportion of the organic acid or the salt thereof may be controlled to preferably at most 1% by mass, more preferably at most 0.5% by mass based on the total mass of the first slurry.

The mixing proportion of the organic acid is controlled within the above-described range, whereby the resulting slurry can achieve sufficient polishing characteristics and becomes stable.

Specific examples of the oxidizing agents include hydrogen peroxide, organic peroxides such as peracetic acid, perbenzoic acid and tert-butyl hydroperoxide, nitric compounds such as nitric acid and iron nitrate, perhalogenic compounds such as perchloric acid, persulfates such as ammonium persulfate, polyvalent metal salts such as iron nitrate and cerium ammonium nitrate, and heteropoly-acids such as silicotungstic acid, phosphotungstic acid, silicomolybdic acid and phosphomolybdic acid. Among these, hydrogen peroxide and organic peroxides, in which no metal element is contained, and decomposition products thereof are harmless, are preferred. By containing these oxidizing agents, a polishing rate can be greatly improved, in particular, when a metal film such as a film to be worked that is formed on a wafer is polished.

These oxidizing agents may be used either singly or in any combination thereof.

The mixing proportion of the oxidizing agent may be controlled to at most 15% by mass, preferably 0.001 to 15% by mass, more preferably 0.03 to 10% by mass, particularly preferably 0.01 to 8% by mass based on the total mass of the first slurry.

The mixing proportion of the oxidizing agent is controlled within the above-described range, whereby the resulting slurry can achieve a sufficiently high polishing rate.

As the surfactants, may be mentioned cationic surfactants, anionic surfactants, nonionic surfactants and amphoteric surfactants.

Among these, the anionic surfactants and nonionic surfactants are preferred.

Specific examples of the cationic surfactants include aliphatic amine salts and aliphatic ammonium salts.

Specific examples of the anionic surfactants include carboxylic acid salts such as fatty acid soap and alkyl ether carboxylic acid salts, sulfonic acid salts such as alkyl benzene sulfonic acid salts, alkyl naphthalene sulfonic acid salts and α-olefinsulfonic acid salts, sulfate salts such as higher alcohol sulfate salts and alkyl ether sulfate salts, and phosphate salts such as alkyl phosphate salts.

Specific examples of the nonionic surfactants include ether type surfactants such as polyoxyethylene alkyl ethers, ether ester type surfactants such as polyoxyethylene ethers of glycerol esters, ester type surfactants such as polyethylene glycol fatty acid esters, glycerol esters and sorbitan esters, acetylene glycol and ethylene oxide adducts thereof, and acetylene alcohol.

Specific examples of the amphoteric surfactants include alkylbetaines and amine oxides.

These surfactants may be used either singly or in any combination thereof. Different kinds of surfactants may also be used in combination.

The mixing proportion of the surfactant may preferably be controlled to at most 1% by mass, more preferably at most 0.5% by mass based on the total mass of the first slurry.

The mixing proportion of the surfactant is controlled within the above range, whereby the resulting slurry can achieve sufficient polishing characteristics and becomes stable.

Specific examples of the water-soluble polymer include cellulose, carboxymethyl cellulose, hydroxyethyl cellulose, polyethylene glycol, polyethyleneimine, and polyacrylic acid and salts thereof.

These water-soluble polymers may be used either singly or in any combination thereof.

The mixing proportion of the water-soluble polymer may be controlled to preferably at most 1% by mass, more preferably at most 0.5% by mass based on the total mass of the first slurry.

The mixing proportion of the water-soluble polymer is controlled within the above range, whereby the resulting slurry can achieve sufficient polishing characteristics and becomes stable.

These additives, which may be optionally contained as needed, may be mixed upon preparation of the first slurry, or may also be mixed in a supply line of the first slurry or on a polishing table upon the practice of the chemical mechanical polishing step by separately preparing an aqueous solution thereof.

The preferable pH of the first slurry varies according to the kind of a film to be polished. For example, when a monocrystalline silicon film or polysilicon film is polished, the preferable pH range is 7 to 13, more preferably 9 to 12. If the pH is lower than 7, sufficient polishing performance may not be achieved in some cases. If the pH exceeds 13 on the other hand, the stability of the slurry itself may be deteriorated in some cases. It is not preferable for the first slurry to have such a too low or high pH.

In order to adjust the pH of the first slurry, an acid or base may be used. Examples of usable bases include potassium hydroxide and ammonia.

As a film to be polished with the first slurry, is preferred a silicon type film. Specific examples thereof include amorphous silicon films, monocrystalline silicon films, polysilicon films, silicon nitride films and the like.

When the silicon type film is polysilicon film or amorphous silicon film, arsenic and phosphorus or the like may be doped into polysilicon and/or amorphous silicon, respectively forming these films.

When chemical mechanical polishing is conducted with the first slurry, the polishing is conducted with the slurry, in which the mixing proportions of the respective components of the water-soluble quaternary ammonium salt, inorganic acid salt and abrasive grains and the optionally contained components fall within the ranges of the specific mixing proportions as described above. The first slurry used in this polishing may be prepared by mixing the respective components in amounts corresponding to the specific mixing proportions. Alternatively, a high-concentration product of a state that concentrations of the respective components are higher than the specific mixing proportions in a polishing applicable state to be actually served for polishing may be prepared in advance, and this high-concentration product may be diluted with water or the like upon the polishing in such a manner that the mixing proportions of the respective components amount to the specific mixing proportions.

The high-concentration product of the first slurry is obtained by mixing the respective components in such a manner that the range of a ratio regarding to the mixing proportions of the respective components equals to the range of a ratio regarding to the specific mixing proportions, and the mixing proportions of the respective components at this time are preferably such that the water-soluble quaternary ammonium salt is at most 10% by mass, the inorganic acid salt is at most 10% by mass, and the abrasive grains are at most 20% by mass, all based on the total mass of the high-concentration product.

The first slurry can exhibit the initial polishing performance in the case where it is used, by diluting it as required, in a chemical mechanical polishing step after stored for a long period of time even when the slurry is either a slurry in a polishing applicable state prepared by mixing the respective components in amounts corresponding to the specific mixing proportions or a slurry in a high-concentration state.

For example, the first slurry can exhibit the initial performance even when it is used in the polishing step after it is stored at 40° C. for 30 days or for 90 days in a high-concentration state and diluted.

Incidentally, the term "initial" means elapsed time of several hours (1 to 5 hours) soon after the mixing of the respective components.

[6] Chemical Mechanical Polishing of Surface to be Polished:

The first chemical mechanical polishing process according to the present invention comprises the step of polishing a surface to be polished with the first slurry.

When chemical mechanical polishing of the surface to be polished is carried out with the first slurry, a commercially available chemical mechanical polishing apparatus such as Model "EPO-112" or Model "EPO-222", manufactured by Ebara Corporation; Model "Mirra", manufactured by Applied Materials Inc.; or the like can be used to conduct the polishing under prescribed polishing conditions.

According to an embodiment of the first chemical mechanical polishing process of the present invention, for example, a groove portion is formed on a semiconductor substrate, a polysilicon film is formed on the whole surface of the semiconductor substrate including this groove, the polysilicon film is then subjected to a polishing treatment using such a chemical mechanical polishing apparatus as described above and the first slurry to remove other portions of the polysilicon film than a portion buried in the groove portion, whereby a buried groove having excellent surface characteristics and composed of the polysilicon can be formed in the groove portion formed on the semiconductor substrate.

According to another embodiment, a silicon oxide film is formed on a semiconductor substrate, and a groove portion is additionally formed on the resultant stacked film. After a polysilicon film is further deposited on the groove portion formed on the stacked film, the deposited polysilicon film is subjected to a polishing treatment using the silicon oxide film as a stopper layer, and a surface exposed by this polishing treatment is treated as a surface to be polished to conduct a polishing treatment using, for example, the above-described chemical mechanical polishing apparatus and the first slurry, whereby a buried groove having excellent surface characteristics and composed of the polysilicon can be formed in the groove portion formed on the stacked film obtained by stacking the silicon oxide film on the semiconductor substrate because the first slurry has excellent polishing and removal selectivity as to the polysilicon film and the silicon oxide film. In this embodiment, even when a polishing treatment is conducted in the same manner as in said embodiment except that a nitride film is formed in place of the silicon oxide film, and this nitride film is used as a stopper layer, a buried groove having excellent surface characteristics and composed of the polysilicon can be formed in the groove portion formed on the stacked film obtained by stacking the nitride film on the semiconductor substrate because the first slurry has excellent polishing and removal selectivity as to the polysilicon film and the nitride film.

According to a further embodiment, a monocrystalline silicon film can be polished in a specular state using the above-described chemical mechanical polishing apparatus and the first slurry.

According to a still further embodiment, a groove portion is formed on a semiconductor substrate, a wiring material film is formed on the whole surface of the semiconductor substrate including this groove, and a chemical mechanical polishing treatment is then conducted using the above-described chemical mechanical polishing apparatus and the first slurry to remove other portions of the wiring material film than a portion buried in the groove portion, whereby a buried wiring having excellent surface characteristics can be formed in the groove portion formed on the semiconductor substrate.

The evaluation of each of the polishing and removal selectivity as to the polysilicon film and the silicon oxide film and the polishing and removal selectivity as to the polysilicon film and the nitride film can be made by polishing the respective films to be polished under the same conditions to compare them, specifically, by determining a ratio of polishing rates between both films. The term, "the same conditions" means that a polishing apparatus of a specific model is used, and the rotating speeds of the platen and head thereof, polishing pressure, polishing time, the kind of a polishing pad used and a feeding amount of the aqueous dispersion for chemical mechanical polishing per unit time are made the same. The "ratio of polishing rates" can be calculated out from the value of respective polishing rates of the polysilicon film, silicon oxide film and nitride film when these films are separately polished under the same conditions.

Examples of the nitride film include a silicon nitride film, a titanium nitride film and tantalum nitride film.

In the first chemical mechanical polishing process of the present invention, a first specific polishing rate ratio represented by a ratio of the polishing rate of a polysilicon film to the polishing rate of a silicon oxide film in the case where the silicon oxide film and polysilicon film are polished under the same conditions may be controlled to at least 30, preferably at least 100, particularly preferably at least 300. Alternatively, a second specific polishing rate ratio represented by a ratio of the polishing rate of a polysilicon film to the polishing rate of a nitride film in the case where the nitride film and polysilicon film are polished under the same conditions may be controlled to at least 50, preferably at least 100, particularly preferably at least 300.

After completion of the polishing treatment, the abrasive grains remaining on the polished surface are preferably removed. The removal of the abrasive grains can be conducted by an ordinary cleaning method. For example, cleaning is conducted with an alkaline washing solution containing ammonia, hydrogen peroxide and water in a mass ratio of about 1:1:5 respectively after brush-scrubbing, whereby the abrasive grains adhered to the surface polished can be removed.

In order to remove impurity metal species adsorbed on the polished surface, cleaning may be conducted with a washing solution composed of, for example, an aqueous solution of citric acid, a mixed aqueous solution of hydrofluoric acid and citric acid or a mixed aqueous solution of hydrofluoric acid and ethylenediamine-tetraacetic acid (EDTA).

When the abrasive grains are composed of organic particles alone, the polished surface may also be heated to a high temperature in the presence of oxygen, thereby burning and removing the organic particles on the polished surface. As examples of a specific method of burning, may be mentioned an ashing treatment by causing oxygen plasma to act or by supplying oxygen radical by down flow. By this method, the organic particles remaining on the polished surface can be easily removed.

[7] Production Process of Semiconductor Device:

The first production process of a semiconductor device according to the present invention is a process for producing a semiconductor device using the first slurry. The term, "semiconductor device" widely means a polished wafer, various devices equipped with this wafer or holding the wafer and various devices equipped with a substrate produced from this wafer (i.e., various devices of which this substrate is combined with).

<Second Slurry>

The second slurry is obtained by mixing at least a water-soluble quaternary ammonium salt, another basic organic compound other than the water-soluble quaternary ammonium salt, an inorganic acid salt, a water-soluble polymer and abrasive grains into an aqueous medium.

The second slurry will hereinafter be described in detail.

The second slurry is provided in the form of an all components-containing type slurry containing at least the water-soluble quaternary ammonium salt, another basic organic compound other than the water-soluble quaternary ammonium salt, the inorganic acid salt, the water-soluble polymer, the abrasive grains and the aqueous medium or a two-liquid mixed type slurry composed of a material for preparing an aqueous dispersion for chemical mechanical polishing.

The material for preparing an aqueous dispersion for chemical mechanical polishing comprises a first aqueous dispersion material (I) obtained by mixing at least a water-soluble quaternary ammonium salt and an inorganic acid salt into an aqueous medium, and a second aqueous dispersion material (II) obtained by mixing at least a water-soluble polymer and another basic organic compound other than the water-soluble quaternary ammonium salt into an aqueous medium, wherein abrasive grains are mixed into at least one of the first aqueous dispersion material (I) and the second aqueous dispersion material (II), and the aqueous dispersion for chemical mechanical polishing is prepared by both of the first aqueous dispersion material (I) and the second aqueous dispersion material (II).

The second slurry may be stored over a long period of time in a high-concentration state as described below. However, the preferred specific mixing proportions of the respective components described below are all values in a polishing applicable state to be served for polishing.

[1] Water-Soluble Quaternary Ammonium Salt and Another Basic Organic Compound other than the Water-Soluble Quaternary Ammonium Salt:

The all components-containing type slurry contains both water-soluble quaternary ammonium salt and another basic organic compound other than the water-soluble quaternary ammonium salt.

In the two-liquid mixed type slurry, the water-soluble quaternary ammonium salt is contained in the first aqueous dispersion material (I), while at least another basic organic compound other than the water-soluble quaternary ammonium salt is contained in the second aqueous dispersion material (II). This second aqueous dispersion material (II) may further contain the water-soluble quaternary ammonium salt.

As the water-soluble quaternary ammonium salt, is preferably used a quaternary alkylammonium salt, and the quaternary alkylammonium salt is preferably a compound represented by the following formula (1):

$$[NR_4]^+[OH]^- \qquad (1)$$

wherein R is an alkyl group having 1 to 4 carbon atoms.

Incidentally, 4 R groups may be the same or different from one another.

As specific examples thereof, the same compounds as those exemplified as the water-soluble quaternary ammonium salt making up the first slurry are mentioned by way of example. Among these, tetramethylammonium hydroxide and tetraethylammonium hydroxide are particularly preferably used.

Examples of another basic organic compound other than the water-soluble quaternary ammonium salt include water-soluble amines.

Examples of the water-soluble amines include (1) alkylamines such as methylamine, dimethylamine, trimethylamine, ethylamine, diethylamine and triethylamine, (2) alkanolamines such as diethanolamine, triethanolamine and aminoethylethanolamine, (3) alkyleneamines such as diethylenetriamine, triethylenetetramine, tetraethylenepentamine, pentaethylenehexamine and triethylenediamine, and (4) imines such as ethyleneimine. Among these, diethanolamine, triethanolamine and the like are preferably used.

A salt of any of the above-mentioned amines may be used as the water-soluble amine.

The water-soluble amines may be used either singly or in any combination thereof.

The mixing proportions of the water-soluble quaternary ammonium salt and another basic organic compound (hereinafter also referred to as "specific basic organic compound") other than the water-soluble quaternary ammonium salt may be both 0.005 to 10% by mass, preferably 0.005 to 8% by mass, more preferably 0.008 to 5% by mass, particularly preferably 0.01 to 4% by mass based on the total mass of the second slurry in the form of the all components-containing type slurry or two-liquid mixed type slurry. If the mixing proportion of the specific basic organic compound is lower than 0.005% by mass, a sufficient polishing rate may not be achieved in some cases. It is not necessary to contain the specific basic organic compound in a proportion exceeding 10% by mass.

The specific basic organic compound is dissolved in the slurry, and a part thereof is contained as an ion.

[2] Inorganic Acid Salt:

As the inorganic acid salt, may be used any of the compounds exemplified as the compound usable as the inorganic acid salt making up the first slurry.

The mixing proportion of the inorganic acid salt may be 0.005 to 8% by mass, preferably 0.005 to 6% by mass, more preferably 0.008 to 4% by mass, particularly preferably 0.01 to 3% by mass based on the total mass of the second slurry in the form of the all components-containing type slurry or two-liquid mixed type slurry.

If the mixing proportion of the inorganic acid salt is lower than 0.005% by mass, the effect of preventing dishing and erosion may become insufficient in some cases. It is not necessary to contain the inorganic acid salt in a proportion exceeding 8% by mass.

[3] Water-Soluble Polymer:

Examples of the water-soluble polymer include cellulose derivatives such as methyl cellulose, methylhydroxyethyl cellulose, methylhydroxypropyl cellulose, hydroxyethyl cellulose, hydroxypropyl cellulose, carboxymethyl cellulose, carboxyethyl cellulose, and carboxymethylhydroxyethyl cellulose; polysaccharides such as chitosan; and besides water-soluble polymers such as polyethylene glycol, polyethyleneimine, polyvinyl pyrrolidone, polyvinyl alcohol, polyacrylic acid and salts thereof, polyacrylamide and polyethylene oxide. Among these, cellulose derivatives, and polyacrylic acid and salts thereof are preferred, with hydroxyethyl cellulose and carboxymethyl cellulose being more preferred.

These water-soluble polymers may be used either singly or in any combination thereof.

The mixing proportion of the water-soluble polymer may be 0.001 to 5% by mass, preferably 0.001 to 3% by mass, more preferably 0.003 to 2% by mass, particularly preferably 0.005 to 1% by mass based on the total mass of the second slurry in the form of the all components-containing type slurry or two-liquid mixed type slurry.

If the mixing proportion of the water-soluble polymer is lower than 0.001% by mass, the effect of preventing dishing and erosion may become insufficient in some cases, and surface defects may be increased. It is not necessary to contain the water-soluble polymer in a proportion exceeding 5% by mass.

[4] Abrasive Grains:

In the second slurry, the abrasive grains are contained as an essential component in the all components-containing type slurry, and contained in at least one of the first aqueous dispersion material (I) and the second aqueous dispersion material (II) in the two-liquid mixed type slurry.

As the abrasive grains, may be used any of the particles exemplified as the particles usable as the abrasive grains making up the first slurry.

The mixing proportion of the abrasive grains may be controlled to 0.01 to 10% by mass, preferably 0.03 to 8% by mass, particularly preferably 0.05 to 5% by mass based on the total mass of the second slurry in the form of the all components-containing type slurry or two-liquid mixed type slurry. If the mixing proportion of the abrasive grains is lower than 0.01% by mass, the resulting slurry cannot achieve any sufficient polishing rate. If the mixing proportion exceeds 10% by mass on the other hand, the resulting slurry becomes high cost and may be deteriorated in shelf stability in some cases.

[5] Aqueous Medium:

The all components-containing type slurry or the first aqueous dispersion material (I) and the second aqueous dispersion material (II) in the two-liquid mixed type slurry making up the second slurry are respectively obtained by mixing the above-described respective components, and optionally contained components into an aqueous medium to disperse them in the aqueous medium. As the aqueous medium, may be used water, a mixed medium comprising water and a water-soluble alcohol in an amount or proportion within a range not impairing the polishing performance, or the like. However, water is particularly preferred.

[6] Other Components:

The all components-containing type slurry is obtained by mixing the water-soluble quaternary ammonium salt, another basic organic compound other than the water-soluble quaternary ammonium salt, the inorganic acid salt, the water-soluble polymer and the abrasive grains into the aqueous medium as described above and may contain additives such as organic acids or salts thereof, oxidizing agents and/or surfactants as needed in addition to the above-described components.

These other additives may also be contained in the two-liquid mixed type slurry. In this case, the other additives may be contained in at least one of the first aqueous dispersion material (I) and the second aqueous dispersion material (II).

As the organic acids and the salts thereof, the oxidizing agents and the surfactants, may be mentioned the same compounds as those exemplified as those which can be contained in the first slurry.

In the two-liquid mixed type slurry, the water-soluble polymer may also be contained in the first aqueous dispersion material (I) as needed.

Specific examples of the water-soluble polymer include the polymers exemplified as those usable as the polymer making up the second aqueous dispersion material (II).

When the water-soluble polymer is also contained in the first aqueous dispersion material (I), the total mixing proportion of the water-soluble polymer contained in both of the first aqueous dispersion material (I) and the second aqueous dispersion material (II) may be 0.001 to 5% by mass, preferably 0.001 to 3% by mass, more preferably 0.003 to 2% by mass, particularly preferably 0.005 to 1% by mass based on the total mass of the two-liquid mixed type slurry.

The mixing proportion of the water-soluble polymer is controlled within the above range, whereby the resulting slurry can achieve sufficient polishing characteristics and becomes stable.

In the case of the all components-containing type slurry, these additives, which may be optionally contained as needed, may be mixed upon preparation thereof, or may also be mixed in a supply line of the slurry or on a polishing table upon the practice of the chemical mechanical polishing step by separately preparing an aqueous solution thereof.

In the case of the two-liquid mixed type slurry, these additives may be respectively mixed upon preparation of the first aqueous dispersion material (I) and the second aqueous dispersion material (II), may be mixed upon mixing of the first aqueous dispersion material (I) with the second aqueous dispersion material (II), or may also be mixed in a supply line of the slurry or on a polishing table upon the practice of the chemical mechanical polishing step by separately preparing an aqueous solution thereof.

The preferable pH of the second slurry is preferably within the same range as the preferable pH range in the first slurry.

Examples of a film to be polished with the second slurry include silicon type films such as silicon oxide films, polysilicon films, monocrystalline silicon films, amorphous silicon films and silicon nitride films, pure metal films such as pure tungsten films, pure aluminum films and pure copper films, and alloy films composed of an alloy of tungsten, aluminum or copper with any other metal. Stopper layers (barrier layers) composed of a metal such as tantalum or titanium, an oxide such as tantalum oxide or titanium oxide, or a nitride such as titanium nitride or tantalum nitride may also be mentioned. The second slurry may be suitably used in polishing of, particularly, silicon type films among these.

With respect to the above "polysilicon film" and "amorphous silicon film", arsenic, phosphorus or the like may be doped into polysilicon and amorphous silicon respectively forming these films. The same shall apply to the polysilicon films and amorphous silicon films described at other places in this specification.

When chemical mechanical polishing is conducted with the second slurry, the polishing is conducted with the slurry, in which the mixing proportions of the respective components and the optionally contained components described as above fall within the ranges of the specific mixing proportions. The second slurry used in this polishing may be prepared by mixing the respective components in amounts corresponding to the specific mixing proportions. Alternatively a high-concentration product of a state that concentrations of the respective components are higher than the concentrations in a polishing applicable state to be actually served for polishing may be prepared in advance, and this high-concentration product may be diluted with water or the like upon the polishing in such a manner that the mixing proportions of the respective components amount to the specific mixing proportions.

The high-concentration product of the second slurry is obtained by mixing the respective components in such a manner that the range of a ratio regarding to the mixing proportions of the respective components equals to the range of a ratio regarding to the specific mixing proportions, and the mixing proportions of the respective components at this time are preferably such that the water-soluble quaternary ammonium salt is at most 10% by mass, the inorganic acid salt is at most 10% by mass, and the abrasive grains are at most 20% by mass, all based on the total mass of the high-concentration product.

The second slurry can exhibit the initial polishing performance in the case where it is used, by diluting it as required, in a chemical mechanical polishing step after stored for a long period of time even when the slurry is either a slurry in a polishing applicable state prepared by mixing the respective components in amounts corresponding to the specific mixing proportions or a slurry in a high-concentration state.

For example, the second slurry can exhibit the initial performance even when it is used in the polishing step after it is stored at 40° C. for 30 days or for 90 days in a high-concentration state and diluted.

When the two-liquid mixed type slurry is used to perform the chemical mechanical polishing step, the first aqueous dispersion material (I) and the second aqueous dispersion material (II) may be mixed for use in a line for feeding the slurry, or may be separately fed to a polishing table of a chemical mechanical polishing apparatus and mixed for use on the polishing table. Further, the first aqueous dispersion material (I) and the second aqueous dispersion material (II) may also be mixed in advance to store the resultant mixture in a tank or the like before use. In this case, the mixture may preferably be used before the stability of the two-liquid mixed type slurry is deteriorated.

No particular limitation is imposed on a ratio of the first aqueous dispersion material (I) to the second aqueous dispersion material (II) so far as intended polishing rate is achieved, dishing, erosion, scratches and the like are sufficiently prevented, and excellent stability is achieved. However, the ratio [(I)/(II)] of the first aqueous dispersion material (I) to the second aqueous dispersion material (II) is preferably 30/70 to 70/30 in terms of a mass ratio.

[7] Chemical Mechanical Polishing of Surface to be Polished:

The second chemical mechanical polishing process according to the present invention comprises the step of polishing a surface to be polished with the second slurry.

When chemical mechanical polishing of the surface to be polished is carried out with the second slurry, the polishing apparatus exemplified as the polishing apparatus usable in the first chemical mechanical polishing process using the first slurry can be used to conduct the polishing under the prescribed polishing conditions.

According to an embodiment of the second chemical mechanical polishing process of the present invention, for example, a groove portion is formed on a semiconductor substrate (also including a semiconductor wafer), a silicon type film such as a polysilicon film or amorphous silicon film is formed on the whole surface of the semiconductor substrate including this groove, the silicon type film is then subjected to a polishing treatment using such a chemical mechanical polishing apparatus as described above and the second slurry to remove other portions of the silicon type film than a portion buried in the groove portion, whereby a buried groove having excellent surface characteristics and composed of silicon such as the polysilicon film or amorphous silicon film can be formed in the groove portion formed on the semiconductor substrate.

According to another embodiment, a silicon oxide film is formed on a semiconductor substrate (also including a semiconductor wafer), and a groove portion is additionally formed on the resultant stacked film. After silicon such as polysilicon or amorphous silicon is further deposited on the groove portion formed on the stacked film, the deposited silicon type film is subjected to a polishing treatment using the silicon oxide film as a stopper layer, and a surface exposed by this polishing treatment is treated as a surface to be polished to conduct a polishing treatment using, for example, the above-described chemical mechanical polishing apparatus and the second slurry, whereby a buried groove having excellent surface characteristics and composed of silicon can be formed in the groove portion formed on the stacked film obtained by stacking the silicon oxide film on the semiconductor substrate because the second slurry has excellent polishing and removal selectivity as to the silicon type film and the silicon oxide film. In this embodiment, even when a polishing treatment is conducted in the same manner as in said embodiment except that a nitride film such as a titanium nitride film, tantalum nitride film or silicon nitride film is formed in place of the silicon oxide film, and this nitride film is used as a stopper layer, a buried groove having excellent surface characteristics and composed of the silicon such as the polysilicon film or amorphous silicon film can be formed in the groove portion formed on the stacked film obtained by stacking the nitride film on the semiconductor substrate because the second slurry has excellent polishing and removal selectivity as to the silicon type film and the nitride film.

According to a further embodiment, a monocrystalline silicon film can be polished in a specular state using the above-described chemical mechanical polishing apparatus and the second slurry.

According to a still further embodiment, a groove portion is formed on a semiconductor substrate, a wiring material film such as a pure metal film such as a pure tungsten film, pure aluminum film or pure copper film, or an alloy film composed of an alloy of tungsten, aluminum or copper with any other metal is formed on the whole surface of the semiconductor substrate including this groove, and a polishing treatment is then conducted using the above-described chemical mechanical polishing apparatus and the second slurry to remove other portions of the wiring material film than a portion buried in the groove portion, whereby a buried wiring having excellent surface characteristics can be formed in the groove portion formed on the semiconductor substrate. Incidentally, a stopper layer composed of a metal such as tantalum or titanium, an oxide such as a tantalum oxide or titanium oxide, a nitride such as titanium nitride or tantalum nitride or the like is generally formed on the surface of the groove formed on the semiconductor substrate, the wiring material film is formed on the surface of the stopper layer, and the polishing treatment is then conducted. In this case, a buried wiring having excellent surface characteristics can be formed because the second slurry has excellent polishing and removal selectivity as to the wiring material film and the stopper layer.

The evaluation of the polishing and removal selectivity as to the silicon type film such as the polysilicon film or amorphous silicon film and the silicon oxide film, the polishing and removal selectivity as to the silicon type film and the nitride film and the polishing and removal selectivity as to the wiring material film and the stopper layer can be made by polishing the respective films to be polished under the same conditions to compare them, specifically, by determining a ratio of polishing rates between the films. The term, "the same conditions" means that a polishing apparatus of a specific model is used, and the rotating speeds of the platen and head thereof, polishing pressure, polishing time, the kind of a polishing pad used and a feed rate of the aqueous dispertion for chemical mechanical polishing per unit time are made the same. The "ratio of polishing rates" can be calculated out from the value of the respective polishing rates of (1) the silicon type film such as the polysilicon film or amorphous silicon film, (2) the silicon oxide film or nitride film that becomes a stopper layer, and (3) the wiring material film when these films are separately polished under the same conditions.

In the second chemical mechanical polishing process of the present invention, a first specific polishing rate ratio represented by a ratio of the polishing rate of a polysilicon film to the polishing rate of a silicon oxide film in the case where the silicon oxide film and polysilicon film are polished under the same conditions may be controlled to at least 30, preferably at least 100, particularly preferably at least 300. Alternatively, a second specific polishing rate ratio represented by a ratio of the polishing rate of a polysilicon film to the polishing rate of a nitride film in the case where the nitride film and polysilicon film are polished under the same conditions may be controlled to at least 50, preferably at least 100, particularly preferably at least 300.

After completion of the polishing treatment, the abrasive grains remaining on the polished surface are preferably removed. The removal of the abrasive grains can be conducted by the removing method exemplified as the removing method usable after completion of the chemical mechanical polishing using the first slurry.

[8] Production Process of Semiconductor Device:

The second production process of a semiconductor device according to the present invention is a process for producing a semiconductor device using the above mentioned second slurry.

EXAMPLES

Examples Related to First Slurry

[1] Preparation of Aqueous Dispersion Containing Abrasive Grains Composed of Inorganic Particles or Composite Particles:

(1) Preparation of Aqueous Dispersion Containing Inorganic Particles:

(a) Preparation of Aqueous Dispersion Containing Fumed Silica Particles:

Fumed silica particles (product of Nippon Aerosil Co., Ltd.; trade name "Aerosil #50") in an amount of 2 kg were added into 6.7 kg of ion-exchanged water and dispersed by means of an ultrasonic dispersing machine, and the dispersion was then filtered through a filter having a pore size of 5 μm to prepare an aqueous dispersion containing the fumed silica particles. The average primary particle diameter of the silica particles in this aqueous dispersion was 30 nm, and the average secondary particle diameter thereof was 230 nm.

(b) Preparation of Aqueous Dispersion Containing Colloidal Silica:

A 2-liter flask was charged with 70 g of aqueous ammonia (concentration: 25% by mass), 40 g of ion-exchanged water, 175 g of ethanol and 21 g of tetraethoxysilane, and the mixture was heated to 60° C. with stirring at 180 rpm. After the mixture was continuously stirred for 2 hours at this temperature, it was cooled to obtain an ethanol dispersion of colloidal silica. A process of removing ethanol by means of an evaporator while adding ion-exchanged water at 80° C. was repeated several times to prepare an aqueous dispersion containing 20% by mass of colloidal silica having an average primary particle diameter of 35 nm and an average secondary particle diameter of 70 nm.

Each of an aqueous dispersion containing 20% by mass of colloidal silica having an average primary particle diameter of 15 nm and an average secondary particle diameter of 25 nm, and an aqueous dispersion containing 20% by mass of colloidal silica having an average primary particle diameter of 70 nm and an average secondary particle diameter of 150 nm were also prepared in substantially the same manner as described above except that the amounts of ethanol and tetraethoxysilane added were changed.

(2) Preparation of Aqueous Dispersion Containing Abrasive Grains Composed of Composite Particles:

(a) Preparation of Aqueous Dispersion Containing Polymer Particles:

A 2-liter flask was charged with 90 parts by mass (hereinafter referred to as "parts" merely) of methyl methacrylate, 5 parts of methoxypolyethylene glycol methacrylate (product of Shin-Nakamura Chemical Co., Ltd.; trade name "NK Ester M-90G, #400"), 5 parts of 4-vinylpyridine, 2 parts of an azo type polymerization initiator (product of Wako Pure Chemical Industries, Ltd.; trade name "V50") and 400 parts of ion-exchanged water, and the mixture was heated to 70° C. with stirring under a nitrogen gas atmosphere to conduct polymerization for 6 hours at the same temperature, thereby obtaining an aqueous dispersion containing polymer particles having an average particle diameter of 150 nm, where the said polymer having an amino group and a polyethylene glycol chain. The yield of the polymerization was 95%.

(b) Preparation of Aqueous Dispersion Containing Composite Particles:

One hundred parts of the aqueous dispersion containing 10% by mass of the polymer particles obtained in the above step (a) were added to a 2-liter flask, 1 part of methyltrimethoxysilane was additionally added, and the resultant mixture was stirred at 40° C. for 2 hours. Thereafter, the pH of the mixture was adjusted to 2 with nitric acid to obtain Aqueous Dispersion (1-a). The pH of an aqueous dispersion containing 10% by mass of colloidal silica (product of Nissan Chemical Industries, Ltd.; trade name "Snowtex O", average primary particle diameter: 10 to 20 nm) was adjusted to 8 with potassium hydroxide to obtain Aqueous Dispersion (1-b). Incidentally, the zeta potential of the polymethyl methacrylate particles contained in Aqueous Dispersion (1-a) was +17 mV, while the zeta potential of the silica particles contained in Aqueous Dispersion (1-b) was −40 mV.

After 50 parts of Aqueous Dispersion (1-b) were gradually added to and mixed with 100 parts of Aqueous Dispersion (1-a) over 2 hours, the resultant mixture was additionally stirred for 2 hours to obtain an aqueous dispersion containing particles with the colloidal silica particles bonded to the polymer particles. To this aqueous dispersion, were added 2 parts of vinyltriethoxysilane, and the mixture was stirred for 1 hour. Thereafter, 1 part of tetraethoxysilane was added, and the mixture was heated to 60° C., continuously stirred for 3 hours at that temperature and then cooled, thereby obtaining an aqueous dispersion containing composite particles. The average particle diameter of the composite particles was 180 nm. Composite Particles were such that the silica particles adhered to the surfaces of the polymer particles so as to cover 80% thereof.

[2] Preparation of High-Concentration Product of Aqueous Dispersion for Chemical Mechanical Polishing:

An ion-exchanged water in an amount that the total mass of the resulting high-concentration product amounted to 100% by mass was added to a 1-liter polyethylene bottle, an aqueous solution of tetramethylammonium hydroxide the concentration of which was 25% by mass was added to the ion-exchanged water so as to give a concentration of 6% by mass in terms of the tetramethylammonium hydroxide content, and the mixture was fully stirred. Thereafter, an aqueous solution (concentration: 20% by mass) of ammonium carbonate was added with stirring so as to give a concentration of 5.5% by mass in terms of the ammonium carbonate content, and at the same time 9% by mass of colloidal silica (average primary particle diameter: 35 nm; average secondary particle diameter: 70 nm) was added. After the resultant mixture was fully stirred, it was filtered through a filter having a pore size of 5 μm to obtain High-Concentration Product [1Ad] of Slurry [1A].

Respective High-Concentration Products [1Bd] to [1Id] of Slurries [1B] to [1I] were obtained in substantially the same manner as described above except that the kinds and mixing amounts of the respective components were changed as shown in Table 1.

An ion-exchanged water in an amount that the total mass of the resulting high-concentration product amounted to 100% by mass was added to a 1-liter polyethylene bottle, and the aqueous solutions shown in the row of "Additive 1" of Table 2 were respectively added to the ion-exchanged water so as to give the respective mixing amounts shown in the row of "Additive 1" of Table 2, and the resultant mixtures were fully stirred. Thereafter, the aqueous solutions shown in the row of "Additive 2" of Table 2 were respectively added with stirring so as to give the respective mixing amounts shown in the row of "Additive 2" of Table 2. At the same time, abrasive grains were added, the resultant mixtures were fully stirred, and they were respectively filtered through a filter having a pore size of 5 μm to obtain High-Concentration Products [1ad] to [1ed] of Comparative Slurries [1a] to [1e].

The particle diameters of the abrasive grains shown in Tables 1 and 2 were described in order of average primary particle diameter and average secondary particle diameter as to the colloidal silica, and only the average secondary particle diameter was described as to the fumed silica. As the particle diameter of the composite particles, was described an average particle diameter.

Abbreviations in Tables 1 and 2 mean the following compounds, respectively.

TMAH: tetramethylammonium hydroxide (25% by mass aqueous solution);

TEAH: tetraethylammonium hydroxide (20% by mass aqueous solution);

TPAH: tetrapropylammonium hydroxide (15% by mass aqueous solution).

Ammonium nitrate mentioned in Table 1 was used in the form of a 20% by mass aqueous solution, KOH mentioned in Table 2 was used in the form of a 10% by mass aqueous solution, diethanolamine was used in the form of a 10% by mass aqueous solution, HCl was used at a concentration of 30% by mass, and these were respectively described as "Ammonium nitrate", "KOH", "Diethanolamine" and "HCl" and mixed so as to give the respective mixing amounts shown in the tables.

TABLE 1

| High-Concentration Product of Slurry | Quaternary Alkyl Ammonium Salt Kind | Amount Mixed (wt %) | Inorganic Acid Salt Kind | Amount Mixed (wt %) | Abrasive Grain Kind | Particle Diameter (nm) | Amount Mixed (wt %) | Other Additives Kind | Amount Mixed (wt %) |
|---|---|---|---|---|---|---|---|---|---|
| 1Ad | TMAH | 6 | Ammonium Carbonate | 5.5 | Colloidal Silica | 35, 70 | 9 | None | — |
| 1Bd | TMAH | 3 | Ammonium Carbonate | 1.6 | Colloidal Silica | 15, 25 | 9 | None | — |
| 1Cd | TEAH | 3 | Ammonium Nitrate | 1.6 | Colloidal Silica | 35, 70 | 9 | None | — |
| 1Dd | TMAH | 2 | Ammonium Nitrate | 0.9 | Colloidal Silica | 35, 70 | 9 | Ammonia | 1 |
| 1Ed | TMAH | 3 | Ammonium Carbonate | 1.4 | Fumed Silica | 230 | 6 | None | — |
| 1Fd | TPAH | 0.6 | Ammonium Carbonate | 0.6 | Colloidal Silica | 70, 150 | 1.8 | None | — |
| 1Gd | TEAH | 4.5 | Ammonium Carbonate | 4 | Colloidal Silica | 35, 70 | 4.5 | None | — |
| 1Hd | TMAH | 3 | Ammonium Carbonate | 1.6 | Composite Particle | 180 | 5 | None | — |
| 1Id | TMAH | 6 | Ammonium Nitrate | 5.5 | Colloidal Silica | 35, 70 | 9 | Hydroxyethyl Cellulose | 0.05 |

TABLE 2

| High-Concentration Product of Slurry | Additive 1 Kind | Amount Mixed (wt %) | Additive 2 Kind | Amount Mixed (wt %) | Abrasive Grain Kind | Particle Diameter (nm) | Amount Mixed (wt %) |
|---|---|---|---|---|---|---|---|
| 1ad | TMAH | 4 | HCl | 3 | Colloidal Silica | 35, 70 | 6 |
| 1bd | TMAH | 6 | None | — | Colloidal Silica | 15, 25 | 6 |
| 1cd | Diethanolamine | 5 | None | — | Fumed Silica | 230 | 6 |
| 1dd | KOH | 5 | None | — | Colloidal Silica | 70, 150 | 9 |
| 1ed | KOH | 5 | HCl | 3 | Colloidal Silica | 70, 150 | 9 |

[3] Preparation of Aqueous Dispersion for Chemical Mechanical Polishing:

After High-Concentration Products [1Ad] to [1Id] and [1ad] to [1ed] prepared in the step [2] were left to stand at 25° C. for 2 hours after the preparation, parts thereof were taken out, and ion-exchanged water was added thereto to dilute them to the respective dilution rates shown in Tables 3 and 4 to obtain Slurries [1A] to [1I] and Comparative Slurries [1a] to [1e] The contents of the respective components and pH values of each of the slurries thus obtained are shown in Tables 3 and 4.

After the high-concentration products were stored at 40° C. for 90 days, they were diluted in the same manner as described above to obtain Slurries [1A] to [1I] and Comparative Slurries [1a] to [1e]. The pH values of the each of the slurries thus obtained are shown in Tables 3 and 4.

Abbreviations, TMAH, TEAH and TPAH in Tables 3 and 4 mean the same compounds as in Tables 1 and 2.

TABLE 3

| Slurry | Dilution Rate | Quaternary Alkyl Ammonium Salt Kind | Amount Mixed (wt %) | Inorganic Acid Salt Kind | Amount Mixed (wt %) | Abrasive Grain Kind | Particle Diameter (nm) | Amount Mixed (wt %) | Other Additives Kind | Amount Mixed (wt %) | pH Diluted 2 Hours After Preparation | pH Diluted 90 Days After Preparation |
|---|---|---|---|---|---|---|---|---|---|---|---|---|
| 1A | 10 | TMAH | 0.6 | Ammonium Carbonate | 0.55 | Colloidal Silica | 35, 70 | 0.9 | None | — | 10.5 | 10.3 |
| 1B | 10 | TMAH | 0.3 | Ammonium Carbonate | 0.16 | Colloidal Silica | 15, 25 | 0.9 | None | — | 10.6 | 10.4 |

TABLE 3-continued

| | | Quaternary Alkyl Ammonium Salt | | Inorganic Acid Salt | | Abrasive Grain | | | Other Additives | | pH | |
|---|---|---|---|---|---|---|---|---|---|---|---|---|
| Slurry | Dilution Rate | Kind | Amount Mixed (wt %) | Kind | Amount Mixed (wt %) | Kind | Particle Diameter (nm) | Amount Mixed (wt %) | Kind | Amount Mixed (wt %) | Diluted 2 Hours After Preparation | Diluted 90 Days After Preparation |
| 1C | 10 | TEAH | 0.3 | Ammonium Nitrate | 0.16 | Colloidal Silica | 35, 70 | 0.9 | None | — | 10.6 | 10.5 |
| 1D | 10 | TMAH | 0.2 | Ammonium Carbonate | 0.09 | Colloidal Silica | 35, 70 | 0.9 | Ammonia | 0.1 | 11.0 | 11.1 |
| 1E | 10 | TMAH | 0.3 | Ammonium Carbonate | 0.14 | Fumed Silica | 230 | 0.6 | None | — | 11.0 | 11.0 |
| 1F | 2 | TPAH | 0.3 | Ammonium Carbonate | 0.3 | Colloidal Silica | 70, 150 | 0.9 | None | — | 9.2 | 9.1 |
| 1G | 5 | TEAH | 0.9 | Ammonium Carbonate | 0.8 | Colloidal Silica | 35, 70 | 0.9 | None | — | 10.6 | 10.4 |
| 1H | 10 | TMAH | 0.3 | Ammonium Carbonate | 0.16 | Composite Particle | 180 | 0.5 | None | — | 10.6 | 10.5 |
| 1I | 10 | TMAH | 0.6 | Ammonium Nitrate | 0.55 | Colloidal Silica | 35, 70 | 0.9 | Hydroxy-ethyl Cellulose | 0.005 | 10.5 | 10.3 |

TABLE 4

| | | Additive 1 | | Additive 2 | | Abrasive Grain | | | pH | |
|---|---|---|---|---|---|---|---|---|---|---|
| Slurry | Dilution Rate | Kind | Amount Mixed (wt %) | Kind | Amount Mixed (wt %) | Kind | Particle Diameter (nm) | Amount Mixed (wt %) | Diluted 2 hours After Preparation | Diluted 90 days After Preparation |
| 1a | 10 | TMAH | 0.4 | HCl | 0.3 | Colloidal silica | 35, 70 | 0.6 | 10.3 | 10.1 |
| 1b | 10 | TMAH | 0.6 | None | — | Colloidal Silica | 15, 25 | 0.6 | 12.1 | 11.5 |
| 1c | 10 | Diethanolamine | 0.5 | None | — | Fumed Silica | 230 | 0.6 | 11.2 | 11.3 |
| 1d | 10 | KOH | 0.5 | None | — | Colloidal Silica | 70, 150 | 0.9 | 12.2 | 11.5 |
| 1e | 10 | KOH | 0.5 | HCl | 0.3 | Colloidal Silica | 70, 150 | 0.9 | 10.5 | 10.5 |

[4] Evaluation of Polishing Performance on Polysilicon Film:

Example 1-1

(i) Evaluation of Polishing Rate Upon Polishing of Polysilicon Film:

Slurry [1A] (product diluted after 2 hours form the preparation) prepared in the step [3] was used, and an 8-inch silicon substrate having a thermal oxidation film was placed on a chemical mechanical polishing apparatus (Model "EPO112", manufactured by Ebara Corporation) to polish a polysilicon film (film thickness: 5,000 Å) formed on the substrate by means of a polishing pad (product of Rodel Nitta, Ltd.; trade name "IC1000") made of porous polyurethane under the following conditions. The polishing rate of the polysilicon film was found to be 4250 Å/min.

Carrier load: 300 g/cm$^2$
Carrier rotating speed: 50 rpm
Platen rotating speed: 55 rpm
Feed rate of slurry: 200 ml/min
Polishing time: 1 minute

[ii] Evaluation of Polishing and Removal Selectivity as to Polysilicon Film and Silicon Oxide Film:

The polishing rate of a silicon oxide film was determined in the same manner as in the evaluation [i] except that an 8-inch silicon oxide film substrate (film thickness: 5,000 Å) was used in place of the 8-inch silicon substrate having a thermal oxidation film in the evaluation [i]. As a result, the polishing rate of silicon oxide film was 5 Å/min. From this fact, the polishing and removal selectivity as to the polysilicon film and the silicon oxide film of Slurry [1A] was able to be calculated as 850.

[iii] Evaluation of Polishing and Removal Selectivity as to Polysilicon Film and Silicon Nitride Film:

The polishing rate of a silicon nitride film was determined in the same manner as in the evaluation [i] except that an 8-inch silicon nitride film substrate (film thickness: 1,000 Å) was used in place of the 8-inch silicon substrate having a thermal oxidation film in the evaluation [i]. As a result, the polishing rate was 5 Å/min. From this fact, the polishing and removal selectivity as to the polysilicon film and the silicon nitride film of Slurry [1A] was able to be calculated as 850.

[iv] Evaluation of Erosion:

A polishing treatment was conducted in the same manner as in the evaluation [i] except that a wafer with polysilicon deposited (amount of polisilicon deposited: 3500 Å) on a silicon oxide film including a pattern of a wiring 50 μm wide/a non-wiring portion 9 μm wide and a pattern of a wiring 2 μm wide/a non-wiring portion 0.35 μm wide was used in place of the 8-inch silicon substrate having a thermal oxidation film in the evaluation [i], and the polishing time was set so as to exceed by 30% as much as the standard time. After the polishing, erosion at an alternate wiring site having the wiring width of 50 μm and an alternate wiring site having the wiring width of 2 μm was measured by means of a step height and surface roughness meter (Model "P-10", manufactured by KLA-Tencor Co.). As a result, erosion at the alternate wiring sites were 750 Å and 600 Å, respectively. When these values are not greater than 1000 Å and 700 Å, respectively, the erosion resistance may safely be said to be good.

Incidentally, the polishing time exceeding by 30% as much as the standard time was calculated in the following manner based on the polishing rate of the polysilicon film measured in the evaluation [i] and performed.

Polishing time (min)=[Amount of polysilicon deposited (Å)/Polishing rate (Å/min) of polysilicon film]×1.3

(v) Evaluation of Stability of High-Concentration Product of Slurry:

Evaluation as to the respective items was made in substantially the same manner as in the evaluation (i) to (iv) except that Slurry [1A] obtained by diluting High-Concentration Product [1Ad] after stored at 40° C. for 90 days after the preparation of High-Concentration Product [1Ad] was used in place of Slurry [1A] obtained by diluting High-Concentration Product [1Ad] after 2 hours from the preparation in the evaluation (i) to (iv). The results are shown in Table 5.

As apparent from Table 5, it was understood that the performance of Slurry [1A] is almost the same between the case where Concentration Product [1Ad] was diluted to be used after 2 hours from the preparation and the case where Concentration Product [1Ad] was diluted to be used after stored at 40° C. for 90 days after the preparation, and thus has excellent long-term stability in a high-concentration state.

Examples 1-2 to 1-7 and Comparative Examples 1-1 to 1-5

Evaluation was made in substantially the same manner as in Example 1-1 except that their corresponding slurries shown in Tables 5 and 6 were used in place of Slurry [1A] in Example 1-1. The results are shown in Tables 5 and 6.

TABLE 5

| | Slurry | Example 1-1 1A | Example 1-2 1C | Example 1-3 1D | Example 1-4 1F | Example 1-5 1G | Example 1-6 1H | Example 1-7 1I |
|---|---|---|---|---|---|---|---|---|
| Diluted 2 hours after Preparation | Polishing Rate of Polysilicon Film (Å/min) | 4250 | 2600 | 3100 | 1800 | 4450 | 2500 | 2000 |
| | Ratio of Polishing rate Polysilicon: Silicon Oxide | 850 | 430 | 365 | 300 | 890 | 500 | 285 |
| | Ratio of Polishing rate Polysilicon: Silicon Nitride | 850 | 520 | 475 | 360 | 740 | 625 | 285 |
| | Erosion (Å) Wiring Width 50 μm | 750 | 600 | 650 | 850 | 900 | 700 | 450 |
| | Wiring Width 2 μm | 600 | 550 | 500 | 700 | 700 | 500 | 400 |
| Diluted 90 days after Preparation | Polishing Rate of Polysilicon Film (Å/min) | 4100 | 2650 | 3150 | 1650 | 4400 | 2600 | 2100 |
| | Ratio of Polishing rate Polysilicon: Silicon Oxide | 820 | 405 | 395 | 330 | 735 | 520 | 300 |
| | Ratio of Polishing rate Polysilicon: Silicon Nitride | 970 | 530 | 450 | 365 | 735 | 650 | 280 |
| | Erosion (Å) Wiring Width 50 μm | 800 | 650 | 750 | 900 | 950 | 750 | 450 |
| | Wiring Width 2 μm | 550 | 550 | 450 | 650 | 650 | 550 | 400 |

TABLE 6

| | Slurry | Comparative Example 1-1 1a | Comparative Example 1-2 1b | Comparative Example 1-3 1c | Comparative Example 1-4 1d | Comparative Example 1-5 1e |
|---|---|---|---|---|---|---|
| Diluted 2 days after Preparation | Polishing Rate of Polysilicon Film (Å/min) | 1300 | 2850 | 200 | 2300 | 1100 |
| | Ratio of Polishing rate Polysilicon: Silicon Oxide | 15 | 30 | less than 1 | 10 | 10 |
| | Ratio of Polishing rate Polysilicon: | 90 | 15 | 60 | 20 | 100 |

TABLE 6-continued

| | Slurry | Comparative Example 1-1 1a | Comparative Example 1-2 1b | Comparative Example 1-3 1c | Comparative Example 1-4 1d | Comparative Example 1-5 1e |
|---|---|---|---|---|---|---|
| | Silicon Nitride Erosion (Å) Wiring Width 50 μm | 1050 | 1450 | 500 | 1200 | 950 |
| | Wiring Width 2 μm | 900 | 1800 | 400 | 1300 | 950 |
| Diluted 90 days after Preparation | Polishing Rate of Polysilicon Film (Å/min) | 1100 | 1200 | 200 | 1550 | 200 |
| | Ratio of Polishing rate Polysilicon: Silicon Oxide | 10 | 5 | less than 1 | 5 | less than 1 |
| | Ratio of Polishing rate Polysilicon: Silicon Nitride | 80 | 5 | 50 | 15 | 30 |
| | Erosion (Å) Wiring Width 50 μm | 1000 | 2050 | 550 | 1650 | 1000 |
| | Wiring Width 2 μm | 950 | 2250 | 400 | 1700 | 900 |

[5] Evaluation of Polishing Performance on Monocrystalline Silicon Film:

Example 1-8

(vi) Evaluation of Polishing Rate of Monocrystalline Silicon Film:

Slurry [1B] (product diluted after 2 hours form the preparation) prepared in the step [3] was used, and a silicon wafer (product of E & M Co.) was placed on a chemical mechanical polishing apparatus (Model "EPO112", manufactured by Ebara Corporation) to conduct polishing by means of a polishing pad (product of Rodel Nitta, Ltd.; trade name "IC1000") made of porous polyurethane under the following conditions. The polishing rate of the monocrystalline silicon film was found to be 1800 Å/min.

Carrier load: 300 g/cm$^2$
Carrier rotating speed: 50 rpm
Platen rotating speed: 55 rpm
Feed rate of slurry: 200 ml/min
Polishing time: 3 minutes (vii) Evaluation of Stability of High-Concentration Product of Slurry:

Evaluation was carried out in substantially the same manner as in the evaluation (vi) except that Slurry [1B] obtained by diluting High-Concentration Product [1Bd] after stored at 40° C. for 90 days after the preparation was used in place of Slurry [1B] obtained by diluting High-Concentration Product [1Bd] after 2 hours from the preparation in the evaluation (vi).

As a result, the polishing rate of the monocrystalline silicon film was 1750 Å/min, and there was little difference from the case where High-Concentration Product [1Bd] was diluted after 2 hours from the preparation.

Example 1-9

Evaluation was carried out in substantially the same manner as in Example 1-8 except that Slurry [1E] was used in place of Slurry [1B] in Example 1-8.

As a result, with respect to Slurry [1E] diluted after 2 hours from the preparation, the polishing rate of the monocrystalline silicon film was 2200 Å/min, while with respect to Slurry [1E] diluted after stored at 40° C. for 90 days after the preparation of High-Concentration Product [1Ed], the polishing rate of the monocrystalline silicon film was 2320 Å/min and was not lowered at all compared with the case where High-Concentration Product [1Ed] was diluted after 2 hours from the preparation.

Examples Related to Second Slurry

[1] Preparation of Aqueous Dispersion Containing Abrasive Grains Composed of Inorganic Particles or Composite Particles:

(1) Preparation of Aqueous Dispersion Containing Inorganic Abrasive Grains (Colloidal Silica):

A 2-liter flask was charged with 70 g of aqueous ammonia (concentration: 25% by mass), 40 g of ion-exchanged water, 175 g of ethanol and 21 g of tetraethoxysilane, and the mixture was heated to 60° C. with stirring at 180 rpm. After the mixture was continuously stirred for 2 hours at this temperature, it was cooled to obtain an ethanol dispersion of colloidal silica. A process of removing ethanol by means of an evaporator while adding ion-exchanged water at 80° C. was repeated several times to prepare an aqueous dispersion containing 20% by mass of colloidal silica having an average primary particle diameter of 35 nm and an average secondary particle diameter of 70 nm.

An aqueous dispersion containing 20% by mass of colloidal silica having an average primary particle diameter of 15 nm and an average secondary particle diameter of 25 nm was also prepared in substantially the same manner as described above except that the amounts of ethanol and tetraethoxysilane added were changed.

(2) Preparation of Aqueous Dispersion Containing Abrasive Grains Composed of Composite Particles:

(a) Preparation of Aqueous Dispersion Containing Polymer Particles:

A 2-liter flask was charged with 90 parts of methyl methacrylate, 5 parts of methoxypolyethylene glycol methacrylate (product of Shin-Nakamura Chemical Co., Ltd.; trade name "NK Ester M-90G, #400"), 5 parts of 4-vinylpyridine, 2 parts of an azo type polymerization initiator (product of Wako Pure Chemical Industries, Ltd.; trade name "V50") and 400 parts of ion-exchanged water, and the mixture was heated to 70° C. with stirring under a nitrogen gas atmosphere to conduct polymerization for 6 hours at the same temperature, thereby obtaining an aqueous dispersion containing polymer particles having an average particle diameter of 150 nm, where the said polymer having an amino group and a polyethylene glycol chain. The yield of the polymerization was 95%.

(b) Preparation of Aqueous Dispersion Containing Composite Particles:

One hundred parts of the aqueous dispersion containing 10% by mass of the polymer particles obtained in the step (a) were added to a 2-liter flask, 1 part of methyltrimethoxysilane was additionally added, and the resultant mixture was stirred at 40° C. for 2 hours. Thereafter, the pH of the mixture was adjusted to 2 with nitric acid to obtain Aqueous Dispersion (2-a). The pH of an aqueous dispersion containing 10% by mass of colloidal silica (product of Nissan Chemical Industries, Ltd.; trade name "Snowtex O", average primary particle diameter: 10 to 20 nm) was adjusted to 8 with potassium hydroxide to obtain Aqueous Dispersion (2-b). Incidentally, the zeta potential of the polymethyl methacrylate particles contained in Aqueous Dispersion (2-a) was +17 mV, while the zeta potential of the silica particles contained in Aqueous Dispersion (2-b) was −40 mV.

After 50 parts of Aqueous Dispersion (2-b) were gradually added to and mixed with 100 parts of Aqueous Dispersion (2-a) over 2 hours, the resultant mixture was additionally stirred for 2 hours to obtain an aqueous dispersion containing particles with the colloidal silica particles bonded to the polymer particles. To this aqueous dispersion, were added 2 parts of vinyltriethoxysilane, and the mixture was stirred for 1 hour. Thereafter, 1 part of tetraethoxysilane was added, and the mixture was heated to 60° C., continuously stirred for 3 hours at that temperature and then cooled, thereby obtaining an aqueous dispersion containing composite particles. The average particle diameter of the composite particles was 180 nm. Composite Particles were such that the silica particles adhered to the surfaces of the polymer particles so as to cover 80% thereof.

[2] Preparation of High-Concentration Product of Aqueous Dispersion for Chemical Mechanical Polishing:

(a) Preparation of First Aqueous Dispersion Material (I):

An ion-exchanged water in an amount that the total mass of the resulting high-concentration product amounted to 100% by mass was added to a 1-liter polyethylene bottle, an aqueous solution of tetramethylammonium hydroxide the concentration of which was 25% by mass was added to the ion-exchanged water so as to give a concentration of 5% by mass in terms of the tetramethylammonium hydroxide content, and the mixture was fully stirred. Thereafter, an aqueous solution of ammonium carbonate was added with stirring so as to give a concentration of 3% by mass in terms of the ammonium carbonate content, and at the same time 9% by mass of colloidal silica (average primary particle diameter: 35 nm; average secondary particle diameter: 70 nm) was added. After the resultant mixture was fully stirred, it was filtered through a filter having a pore size of 5 μm to obtain High-Concentration Product [2Ad] of Aqueous Dispersion [2A] that is First Aqueous Dispersion Material (I) making up a two-liquid mixed type slurry.

Respective High-Concentration Products [2Bd] to [2Ed] of Aqueous Dispersions [2B] to [2E] that are First Aqueous Dispersion Materials (I) were obtained in substantially the same manner as described above except that the kinds and mixing amounts of the respective components were changed as shown in Table 7.

An ion-exchanged water in an amount that the total mass of the resulting high-concentration product amounted to 100% by mass was added to a 1-liter polyethylene bottle, and the aqueous solutions shown in the row of "Additive 1" of Table 8 were respectively added to the ion-exchanged water so as to give the respective mixing amounts shown in the row of "Additive 1" of Table 8, and the resultant mixtures were fully stirred. Thereafter, the aqueous solutions shown in the row of "Additive 2" of Table 8 were respectively added with stirring so as to give the respective mixing amounts shown in the row of "Additive 2" of Table 8. At the same time, abrasive grains were added, the resultant mixtures were fully stirred, and they were respectively filtered through a filter having a pore size of 5 μm to obtain respective High-Concentration Products [2Fd] and [2Gd] of Aqueous Dispersions [2F] and [2G] that are Comparative First Aqueous Dispersion Materials (I).

(b) Preparation of Second Aqueous Dispersion Material (II):

An ion-exchanged water in an amount that the total mass of the resulting high-concentration product amounted to 100% by mass was added to a 1-liter polyethylene bottle, an aqueous solution of hydroxyethyl cellulose was added to the ion-exchanged water so as to give a concentration of 0.15% by mass in terms of the hydroxyethyl cellulose content, and the mixture was fully stirred. Thereafter, an aqueous solution of triethanolamine and an aqueous solution of tetramethylammonium hydroxide were added with stirring so as to give concentrations of 3% by mass and 0.1% by mass in terms of the triethanolamine content and tetramethylammonium hydroxide content, respectively, and colloidal silica (average primary particle diameter: 35 nm; average secondary particle diameter: 70 nm) was added so as to give a mixing amount of 2.5% by mass. After the resultant mixture was fully stirred, it was filtered through a filter having a pore size of 5 μm to obtain High-Concentration Product [2ad] of Aqueous Dispersion [2a] that is Second Aqueous Dispersion Material (II) making up the two-liquid mixed type slurry.

Respective High-Concentration Products [2bd] to [2dd] of Aqueous Dispersions [2b] to [2d] that are Second Aqueous Dispersion Materials (II) were obtained in substantially the same manner as described above except that the kinds and mixing amounts of the respective components were changed as shown in Table 7.

Hydroxyethyl cellulose, and carboxymethyl cellulose used in Aqueous Dispersion [2dd] were purified by respectively feeding aqueous solutions thereof to a resin column packed with a mixture of an H type ion-exchange resin and an OH type ion-exchange resin at a fixed rate from one direction to bring them into contact with the ion-exchange resins.

An ion-exchanged water in an amount that the total mass of the resulting high-concentration product amounted to 100% by mass was added to a 1-liter polyethylene bottle, and the aqueous solutions shown in the row of "Additive 3" of Table 8 were respectively added to the ion-exchanged water so as to give the respective mixing amounts shown in the row of "Additive 3" of Table 8, and the resultant mixtures were fully stirred. Thereafter, the aqueous solutions shown in the row of "Additive 4" of Table 8 were respectively added with stirring so as to give the respective mixing amounts shown in the row of "Additive 4" of Table 8. At the same time, abrasive grains were added, the resultant mixtures were fully stirred, and they were respectively filtered through a filter having a pore size of 5 μm to obtain respective High-Concentration Products [2ed] and [2fd] of Aqueous Dispersions [2e] and [2f] that are Comparative Second Aqueous Dispersion Materials (II). Incidentally, the particle diameters of the abrasive grains shown in Tables 7 and 8 were described in order of average primary particle diameter and average secondary particle diameter as to the colloidal silica. As the particle diameter of the composite particles, was described an average particle diameter.

Abbreviations in Tables 7 and 8 mean the following compounds, respectively.

TMAH: tetramethylammonium hydroxide (25% by mass aqueous solution);
TEAH: tetraethylammonium hydroxide (20% by mass aqueous solution);
HEC: hydroxyethyl cellulose (1% by mass aqueous solution);
CMC: carboxymethyl cellulose (1% by mass aqueous solution).

Ammonium carbonate in Table 7 was used in the form of a 20% by mass aqueous solution, ammonium nitrate was used in the form of a 20% by mass aqueous solution, and triethanolamine and diethanolamine were used in the form of a 20% by mass aqueous solution, while KOH in Table 8 was used in the form of a 10% by mass aqueous solution, and HCl was used at a concentration of 30% by mass. These were respectively prepared so as to give respective mixing amounts shown in Tables 7 and 8.

TABLE 7

| | High-Concentration Product of Aqueous Dispersion | Quaternary Alkyl Ammonium Salt Kind | Amount Mixed (wt %) | Inorganic Acid Salt Kind | Amount Mixed (wt %) | Abrasive Grain Kind | Particle Diameter (nm) | Amount Mixed (wt %) | Other Additives Kind | Amount Mixed (wt %) |
|---|---|---|---|---|---|---|---|---|---|---|
| Liquid I | 2Ad | TMAH | 5.0 | Ammonium Carbonate | 3.0 | Colloidal Silica | 35, 70 | 9.0 | None | — |
| | 2Bd | TMAH | 3.0 | Ammonium Nitrate | 1.6 | Colloidal Silica | 15, 25 | 9.0 | None | — |
| | 2Cd | TEAH | 4.5 | Ammonium Carbonate | 4.0 | Colloidal Silica | 35, 70 | 4.5 | None | — |
| | 2Dd | TMAH | 3.0 | Ammonium Carbonate | 1.6 | Composite Particle | 180 | 5.0 | None | — |
| | 2Ed | TMAH | 2.0 | Ammonium Carbonate | 0.9 | Colloidal Silica | 35, 70 | 9.0 | Ammonia | 1.0 |

| | High-Concentration Product of Aqueous Dispersion | Water Soluble Polymer Kind | Amount Mixed (wt %) | Basic Organic Compound Kind | Amount Mixed (wt %) | Abrasive Grain Kind | Particle Diameter (nm) | Amount Mixed (wt %) | Other Additives Kind | Amount Mixed (wt %) |
|---|---|---|---|---|---|---|---|---|---|---|
| Liquid II | 2ad | HEC | 0.15 | Triethanolamine | 3.0 | Colloidal Silica | 35, 70 | 2.5 | TMAH | 0.1 |
| | 2bd | HEC | 0.50 | Diethanolamine | 5.0 | Colloidal Silica | 15, 25 | 6.0 | None | — |
| | 2cd | HEC | 0.60 | Triethanolamine | 7.0 | Composite Particle | 180 | 6.0 | TMAH | 0.05 |
| | 2dd | CMC | 0.75 | Triethanolamine | 4.5 | None | — | — | None | — |

TABLE 8

| | High-Concentration Product of Aqueous Dispersion | Additive 1 Kind | Amount Mixed (wt %) | Additive 2 Kind | Amount Mixed (wt %) | Abrasive Grain Particle Kind | Diameter (nm) | Amount Mixed (wt %) |
|---|---|---|---|---|---|---|---|---|
| Liquid I | 2Fd | TMAH | 4.0 | HCl | 3.0 | Colloidal Silica | 35, 70 | 6.0 |
| | 2Gd | KOH | 5.0 | None | — | Colloidal Silica | 35, 70 | 9.0 |

| | High-Concentration Product of Aqueous Dispersion | Additive 3 Kind | Amount Mixed (wt %) | Additive 4 Kind | Amount Mixed (wt %) | Abrasive Grain Particle Kind | Diameter (nm) | Amount Mixed (wt %) |
|---|---|---|---|---|---|---|---|---|
| Liquid II | 2ed | HEC | 0.5 | KOH | 0.2 | Colloidal Silica | 35, 70 | 2.5 |
| | 2fd | None | — | Triethanolamine | 5.0 | Colloidal Silica | 15, 25 | 6.0 |

Incidentally, in Tables 7 and 8, "Liquid I" and "Liquid II" mean First Aqueous Dispersion Material (I) and Second Aqueous Dispersion Material (II), respectively.

[3] Preparation of Aqueous Dispersion (Two-Liquid Mixed Type Slurry) for Chemical Mechanical Polishing:

After High-Concentration Products [2Ad] to [1Gd] and [2ad] to [2fd] prepared in the above step [2] were left to stand at 25° C. for 2 hours after the preparation, parts thereof were taken out, and ion-exchanged water was added thereto to dilute them to the respective dilution rates shown in Tables 9 and 10 to obtain Slurries [2A] to [2G] and Comparative Slurries [2a] to [2f]. The contents of the respective components and pH values of the slurries thus obtained are shown in Tables 9 and 10.

After the respective high-concentration products of above were stored at 40° C. for 90 days, they were diluted in the same manner as described above to obtain Slurries [2A] to [2G] and Comparative Slurries [2a] to [2f]. The pH values of the slurries thus obtained are shown in Tables 9 and 10.

Abbreviations, TMAH, TEAH, HEC and CMC in Tables 9 and 10 mean the same compounds as in Tables 7 and 8.

TABLE 9

| | | | Quaternary Alkyl Ammonium Salt | | Inorganic Acid Salt | | Abrasive Grain | | | Other Additives | | pH Diluted 2 hours after Preparation | pH Diluted 90 days after Preparation |
|---|---|---|---|---|---|---|---|---|---|---|---|---|---|
| Liquid I | Slurry | Dilution Rate | Kind | Amount Mixed (wt %) | Kind | Amount Mixed (wt %) | Kind | Particle Diameter (nm) | Amount Mixed (wt %) | Kind | Amount Mixed (wt %) | | |
| | 2A | 10 | TMAH | 0.5 | Ammonium Carbonate | 0.3 | Colloidal Silica | 35, 70 | 0.9 | None | — | 10.8 | 10.8 |
| | 2B | 10 | TMAH | 0.3 | Ammonium Nitrate | 0.16 | Colloidal Silica | 15, 25 | 0.9 | None | — | 10.6 | 10.5 |
| | 2C | 5 | TEAH | 0.9 | Ammonium Carbonate | 0.8 | Colloidal Silica | 35, 70 | 0.9 | None | — | 10.6 | 10.4 |
| | 2D | 10 | TMAH | 0.3 | Ammonium Carbonate | 0.16 | Composit Particle | 180 | 0.5 | None | — | 10.6 | 10.5 |
| | 2E | 10 | TMAH | 0.2 | Ammonium Carbonate | 0.09 | Colloidal Silica | 35, 70 | 0.9 | Ammonia | 0.1 | 11.0 | 11.1 |

| | | | Water Soluble Polymer | | Basic Organic Compound | | Abrasive Grain | | | Other Additives | | pH Diluted 2 hours after Preparation | pH Diluted 90 days after Preparation |
|---|---|---|---|---|---|---|---|---|---|---|---|---|---|
| Liquid II | Slurry | Dilution Rate | Kind | Amount Mixed (wt %) | Kind | Amount Mixed (wt %) | Kind | Particle Diameter (nm) | Amount Mixed (wt %) | Kind | Amount Mixed (wt %) | | |
| | 2a | 5 | HEC | 0.03 | Tri-ethanolamine | 0.6 | Colloidal Silica | 35, 70 | 0.5 | TMAH | 0.02 | 10.1 | 10.1 |
| | 2b | 5 | HEC | 0.1 | Di-ethanolamine | 1.0 | Colloidal Silica | 15, 25 | 1.2 | None | — | 10.3 | 10.2 |
| | 2c | 10 | HEC | 0.06 | Tri-ethanolamine | 0.7 | Composit Particle | 180 | 0.6 | TMAH | 0.005 | 10.2 | 10.2 |
| | 2d | 5 | CMC | 0.15 | Tri-ethanolamine | 0.9 | None | — | — | None | — | 10.6 | 10.5 |

TABLE 10

| | | | Additive 1 | | Additive 2 | | Abrasive Grain | | | pH Diluted 2 hours after Preparation | pH Diluted 90 days after Preparation |
|---|---|---|---|---|---|---|---|---|---|---|---|
| Liquid I | Slurry | Dilution Rate | Kind | Amount Mixed (wt %) | Kind | Amount Mixed (wt %) | Kind | Particle Diameter (nm) | Amount Mixed (wt %) | | |
| | 2F | 10 | TMAH | 0.4 | HEC | 0.3 | Colloidal Silica | 35, 70 | 0.6 | 10.3 | 10.1 |
| | 2G | 10 | KOH | 0.5 | None | — | Colloidal Silica | 35, 70 | 0.9 | 12.2 | 11.5 |

TABLE 10-continued

| Liquid II | Slurry | Dilution Rate | Additive 3 Kind | Additive 3 Amount Mixed (wt %) | Additive 4 Kind | Additive 4 Amount Mixed (wt %) | Abrasive Grain Kind | Abrasive Grain Particle Diameter (nm) | Abrasive Grain Amount Mixed (wt %) | pH Diluted 2 hours after Preparation | pH Diluted 3 months after Preparation |
|---|---|---|---|---|---|---|---|---|---|---|---|
| | 2e | 5 | HEC | 0.1 | KOH | 0.04 | Colloidal Silica | 35, 70 | 0.5 | 10.3 | 10.1 |
| | 2f | 10 | None | — | Tri-ethanolamine | 0.5 | Colloidal Silica | 15, 25 | 0.6 | 11.2 | 11.0 |

Incidentally, in Tables 9 and 10, "Liquid I" and "Liquid II" mean First Aqueous Dispersion Material (I) and Second Aqueous Dispersion Material (II), respectively.

[4] Evaluation of Polishing Performance on Polysilicon Film:

Example 2-1

(i) Evaluation of Polishing Rate on Polysilicon Film:

Aqueous Dispersion [2A] (product diluted after 2 hours form the preparation) and Aqueous Dispersion [2a] (product diluted after 2 hours form the preparation) prepared in the step [3] were used to polish a polysilicon film (film thickness: 5,000 Å) on an 8-inch silicon substrate having a thermal oxidation film. Specifically, the silicon substrate was placed on a chemical mechanical polishing apparatus (Model "EPO112", manufactured by Ebara Corporation) to polish the polysilicon film by means of a polishing pad (product of Rodel Nitta, Ltd.; trade name "IC1000") made of porous polyurethane under the following conditions. The respective aqueous dispersions were fed to a platen through separate lines. The polishing rate of the polysilicon film was found to be 2500 Å/min.
    Carrier load: 300 g/cm²
    Carrier rotating speed: 50 rpm
    Platen rotating speed: 55 rpm
    Feeding rate of slurry 125 ml/min
    Polishing time: 1 minute.

[ii] Evaluation of Polishing and Removal Selectivity as to Polysilicon Film and Silicon Oxide Film:

The polishing rate of a silicon oxide film was determined in the same manner as in the evaluation [i] except that an 8-inch silicon oxide film substrate (film thickness: 5,000 Å) was used in place of on the 8-inch silicon substrate having a thermal oxidation film in the evaluation [i], and the polishing time was changed to 3 minutes. As a result, the polishing rate was 6 Å/min. From this fact, the polishing and removal selectivity as to the polysilicon film and the silicon oxide film of the two-liquid mixed type slurry composed of a mixture of Aqueous Dispersion [2A] and Aqueous Dispersion [2a] was able to be calculated as 415.

[iii] Evaluation of Polishing and Removal Selectivity as to Polysilicon Film and Silicon Nitride Film:

The polishing rate of a silicon nitride film was determined in the same manner as in the evaluation [i] except that an 8-inch silicon nitride film substrate (film thickness: 1,000 Å) was used in place of the 8-inch silicon substrate having a thermal oxidation film in the evaluation [i], and the polishing time was changed to 3 minutes. As a result, the polishing rate was 5 Å/min. From this fact, the polishing and removal selectivity as to the polysilicon film and the silicon nitride film of the two-liquid mixed type slurry composed of a mixture of Aqueous Dispersion [2A] and Aqueous Dispersion [2a] was able to be calculated as 500.

[iv] Evaluation of Erosion:

A polishing treatment was conducted in the same manner as in the evaluation [i] except that a wafer with polysilicon deposited (amount of polisilicon deposited: 3500 Å) on a silicon oxide film including a pattern of a wiring 50 μm wide/a non-wiring portion 9 μm wide and a pattern of a wiring 2 μm wide/a non-wiring portion 0.35 μm wide was used in place of the 8-inch silicon substrate having a thermal oxidation film in the evaluation [i], and the polishing time was set so as to exceed by 30% as much as the standard time. After the polishing, erosion at an alternate wiring site having the wiring width of 50 μm and an alternate wiring site having the wiring width of 2 μm was measured by means of a step height and surface roughness meter (Model "P-10", manufactured by KLA-Tencor Co.). As a result, erosion at the alternate wiring sites were 510 Å 440 Å, respectively. When these values are not greater than 600 Å and 500 Å, respectively, the erosion resistance may safely be said to be good.

Incidentally, the polishing time exceeding by 30% as much as the standard time was calculated in the following manner based on the polishing rate of the polysilicon film measured in the evaluation [i] and performed.

Polishing time (min)=[Amount of polysilicon deposited (Å)/Polishing rate (Å/min) of polysilicon film]×1.3

(v) Evaluation of Scratches:

With respect to the polysilicon films after polished in the evaluation (i), the total number of scratches occurred on the whole surface of each of the polished surfaces was counted by means of a wafer defect inspection apparatus (Model "KLA2351", manufactured by KLA-Tencor Co.). As a result, one scratch was counted.

(vi) Evaluation of Stability of High-Concentration Product of Aqueous Dispersion:

Evaluation as to the respective items was made in substantially the same manner as in the evaluation (i) to (v) except that a two-liquid mixed type slurry obtained by diluting High-Concentration Products [2Ad] and [2ad] after stored at 40° C. for 90 days after the preparation was used in place of the two-liquid mixed type slurry obtained by diluting High-Concentration Products [2Ad] and [2ad] after 2 hours from the preparation in the evaluation (i) to (v). The results are shown in Table 11.

As apparent from Table 11, it was understood that the performance of Aqueous Dispersion [2A] and Aqueous Dispersion [2a] is almost the same between the case where High-Concentration Products [2Ad] and [2ad] were diluted for use after 2 hours from the preparation and the case where High-Concentration Products [2Ad] and [2ad] were diluted for use after stored at 40° C. for 90 days after the preparation, and thus have excellent long-term stability in a high-concentration state.

Examples 2-2 to 2-7 and Comparative Examples 2-1 to 2-5

Evaluation was made in substantially the same manner as in Example 2-1 except that their corresponding first aqueous dispersion material (I) and second aqueous dispersion material (II) shown in Tables 11 and 12 were used in place of Aqueous Dispersions [2A] and [2a] in Example 2-1. The results are shown in Tables 11 and 12.

TABLE 11

| | | Example 2-1 | Example 2-2 | Example 2-3 | Example 2-4 | Example 2-5 | Example 2-6 | Example 2-7 |
|---|---|---|---|---|---|---|---|---|
| First Aqueous Dispersion Material (I) | | 2A | 2A | 2B | 2C | 2A | 2D | 2E |
| Second Aqueous Dispersion Material (II) | | 2a | 2a | 2b | 2d | 2d | 2c | 2d |
| Mixing Method (I:II) | | Mixed on Table | Mixed on Table | Mixed by Supply Line | Mixed by Supply Line | Mixed on Table | Mixed by Supply Line | Mixed by Supply Line |
| Ratio of Feeding Rate of Slurry (I:II) | | 125:125 | 75:175 | 125:125 | 175:75 | 150:150 | 175:100 | 125:125 |
| Diluted 2 hours after Preparation | Polishing Rate of Polysilicon Film (Å/min) | 2500 | 1750 | 1200 | 2950 | 1900 | 2300 | 2200 |
| | Ratio of Polishing rate Polysilicon: Silicon Oxide | 415 | 350 | 240 | 420 | 270 | 460 | 440 |
| | Ratio of Polishing rate Polysilicon: Silicon Nitride | 500 | 435 | 300 | 490 | 380 | 575 | 550 |
| | Erosion (Å) Wiring Width 50 μm | 510 | 350 | 350 | 550 | 500 | 500 | 400 |
| | Wiring Width 2 μm | 440 | 300 | 300 | 500 | 400 | 350 | 350 |
| | Scratch (counts/wafer) | 1 | 0 | 1 | 2 | 0 | 1 | 0 |
| Diluted 90 days after Preparation | Polishing Rate of Polysilicon Film (Å/min) | 2450 | 1600 | 1150 | 2800 | 1950 | 2400 | 2250 |
| | Ratio of Polishing rate Polysilicon: Silicon Oxide | 410 | 320 | 290 | 400 | 280 | 400 | 450 |
| | Ratio of Polishing rate Polysilicon: Silicon Nitride | 490 | 400 | 290 | 560 | 325 | 600 | 560 |
| | Erosion (Å) Wiring Width 50 μm | 450 | 350 | 300 | 600 | 600 | 450 | 400 |
| | Wiring Width 2 μm | 400 | 350 | 300 | 450 | 450 | 400 | 350 |
| | Scratch (counts/wafer) | 1 | 0 | 0 | 3 | 1 | 0 | 0 |

TABLE 12

| | | Comparative Example 2-1 | Comparative Example 2-2 | Comparative Example 2-3 | Comparative Example 2-4 | Comparative Example 2-5 |
|---|---|---|---|---|---|---|
| First Aqueous Dispersion Material (I) | | 2A | — | 2F | 2G | 2A |
| Second Aqueous Dispersion Material (II) | | — | 2a | 2e | 2f | 2e |
| Mixing Method (I:II) | | Mixed on Table | Mixed on Table | Mixed by Supply Line | Mixed by Supply Line | Mixed on Table |
| Ratio of Feeding Rate of Slurry (I:II) | | 200:— | —:200 | 125:125 | 175:75 | 75:175 |
| Diluted 2 hours after Preparation | Polishing Rate of Polysilicon Film (Å/min) | 4250 | 450 | 1100 | 3300 | 1800 |
| | Ratio of Polishing rate Polysilicon: Silicon Oxide | 850 | 150 | 15 | 660 | 35 |
| | Ratio of Polishing rate Polysilicon: Silicon Nitride | 850 | 225 | 90 | 825 | 180 |
| | Erosion (Å) Wiring Width 50 μm | 750 | 350 | 1000 | 900 | 800 |
| | Wiring Width 2 μm | 600 | 300 | 900 | 800 | 700 |
| | Scratch (counts/wafer) | 30 | 0 | 1 | 50 | 15 |

TABLE 12-continued

|  |  | Comparative Example 2-1 | Comparative Example 2-2 | Comparative Example 2-3 | Comparative Example 2-4 | Comparative Example 2-5 |
|---|---|---|---|---|---|---|
| Diluted 90 days after Preparation | Polishing Rate of Polysilicon (Å/min) | 4100 | 550 | 1200 | 3100 | 1850 |
|  | Ratio of Polishing rate Polysilicon: Silicon Oxide | 820 | 180 | 15 | 620 | 35 |
|  | Ratio of Polishing rate Polysilicon: Silicon Nitride | 910 | 275 | 85 | 775 | 185 |
|  | Erosion (Å) Wiring Width 50 µm | 800 | 350 | 1050 | 950 | 850 |
|  | Wiring Width 2 µm | 400 | 300 | 950 | 800 | 700 |
|  | Scratch (counts/wafer) | 45 | 0 | 0 | 45 | 10 |

[5] Evaluation of Polishing Performance on Monocrystalline Silicon Film:

Example 2-8

(vii) Evaluation of Polishing Rate of Monocrystalline Silicon Film:

Aqueous Dispersions [2A] and [2a] (products diluted after 2 hours form the preparation) prepared in the step [3] were used, and a silicon wafer (product of E & M Co.) was placed on a chemical mechanical polishing apparatus (Model "EPO112", manufactured by Ebara Corporation) to conduct polishing in the same manner as in the step [4](i). The polishing rate of the monocrystalline silicon film was 1400 Å/min.

(viii) Evaluation of Scratches:

With respect to the silicon wafer after polished in the evaluation (vii), the number of scratches was counted in the same manner as in the evaluation (v). As a result, no scratch was counted.

(ix) Evaluation of Stability of High-Concentration Product of Aqueous Dispersions:

Evaluation was carried out in substantially the same manner as in the evaluation (vii) except that a two-liquid mixed type slurry obtained by diluting High-Concentration Products [2Ad] and [2ad] after stored at 40° C. for 90 days after the preparation was used in place of the two-liquid mixed type slurry obtained by diluting High-Concentration Products [2Ad] and [2ad] after 2 hours from the preparation in the evaluation (vii).

As a result, the polishing rate of the monocrystalline silicon film was 1300 Å/min, no scratch was counted, and there was little difference in polishing performance even when a two-liquid mixed type slurry obtained by diluting High-Concentration Products [2Ad] and [2ad] after stored at 40° C. for 90 days after the preparation was used.

[Effect of the Invention]

The first aqueous dispersion for chemical mechanical polishing according to the present invention is excellent in surface planarizing ability, hence, occurrence of dishing, erosion or the like in a plarnarizing step of a surface to be polished by chemical mechanical polishing is low, and high in shelf stability, therefore prevents deterioration with time even in storage in a state of a high concentration and so excellent in long-term stability.

The first chemical mechanical polishing process according to the present invention achieves a high polishing rate when a silicon film such as a polysilicon film is polished, and has excellent selectivity when a polysilicon film and a silicon oxide film are polished and removed and excellent selectivity when a polysilicon film and a nitride film are polished and removed.

The second aqueous dispersion for chemical mechanical polishing according to the present invention is excellent in surface planarizing ability, hence, occurrence of dishing, erosion or the like in a plarnarizing step of a surface to be polished by chemical mechanical polishing is low, does not cause or at least lessens surface defects including scratches, is high in shelf stability, therefore prevents deterioration with time even in storage in a state of a high concentration and so excellent in long-term stability.

In the second aqueous dispersion for chemical mechanical polishing according to the present invention, a polishing rate is more improved when the water-soluble quaternary ammonium salt is a compound represented by the formula (1).

When the inorganic acid salt is an inorganic ammonium salt, dishing and erosion can be sufficiently prevented.

When it is used in polishing of a silicon type film, the polishing rate is high, and dishing and the like are prevented.

According to the second chemical mechanical polishing process of the present invention, a surface to be polished can be polished at a sufficient rate, dishing, erosion and the like can be lessened, and scratches can also be prevented.

When a ratio of the polishing rate of a polysilicon film to the polishing rate of a silicon oxide film is at least 30 when polishing is conducted under the same conditions, these films can be polished with sufficient selectivity.

When a ratio of the polishing rate of a polysilicon film to the polishing rate of a nitride film is at least 50 when polishing is conducted under the same conditions, these film and layer can be polished with sufficient selectivity.

According to the production process of a semiconductor device of the present invention, there can be provided semiconductor devices having excellent surface smoothing and high quality.

The invention claimed is:

1. A chemical mechanical polishing process comprising a step of polishing a surface to be polished formed of polysilicon film or an amorphous silicon film, with an aqueous dispersion obtained by mixing at least a water-soluble quaternary ammonium salt, a basic organic compound other than the water-soluble quaternary ammonium salt, an inorganic acid salt, a water-soluble polymer and abrasive grains into an aqueous medium, wherein a specific removal rate ratio represented by a ratio of the removal rate of the polysilicon film or the amorphous silicon film to the removal rate of a silicon oxide film in the case where the silicon oxide film and the polysilicon film or the amorphous silicon film are polished under the same condition, is at least 30.

2. A chemical mechanical polishing process comprising a step of polishing a surface to be polished formed of polysilicon film or an amorphous silicon film, with an aqueous dispersion obtained by mixing at least a water-soluble quaternary ammonium salt, a basic organic compound other than the water-soluble quaternary ammonium salt, an inorganic acid salt, a water-soluble polymer and abrasive grains into an aqueous medium, wherein a specific removal rate ratio represented by a ratio of the removal rate of the polysilicon film or the amorphous silicon film the removal rate of a nitride film in the case where the nitride film and the polysilicon film or the amorphous silicon film are polished under the same condition, is at least 50.

3. The chemical mechanical polishing process according to claim 1, wherein the aqueous dispersion contains the water-soluble quaternary ammonium salt, the basic organic compound other than the water-soluble quaternary animonium salt, the inorganic acid salt, the water-soluble polymer and the abrasive grains in proportions of 0.005 to 10% by mass, 0.005 to 10% by mass, 0.005 to 8% by mass, 0.001 to 5% by mass and 0.01 to 10% by mass, respectively.

4. The chemical mechanical polishing process according to claim 1, wherein the water-soluble quaternary ammonium salt contained in the aqueous dispersion is a compound represented by the following formula (1):

$$[NR_4]^+[OH]^- \qquad (1)$$

wherein R is an alkyl group having 1 to 4 carbon atoms.

5. The chemical mechanical polishing process according to claim 1, wherein the inorganic acid salt contained in the aqueous dispersion is an inorganic ammonium salt.

6. The chemical mechanical polishing process according to claim 2, wherein the aqueous dispersion contains the water-soluble quaternary ammonium salt, the basic organic compound other than the water-soluble quaternary ammonium salt, the inorganic acid salt, the water-soluble polymer and the abrasive grains in proportions of 0.005 to 10% by mass, 0.005 to 10% by mass, 0.005 to 8% by mass, 0.00 1 to 5% by mass and 0.01 to 10% by mass, respectively.

7. The chemical mechanical polishing process according to claim 2, wherein the water-soluble quaternary ammonium salt contained in the aqueous dispersion is a compound represented by the following formula (1):

$$[NR_4]^+[OH]^- \qquad (1)$$

wherein R is an alkyl group having 1 to 4 carbon atoms.

8. The chemical mechanical polishing process according to claim 2, wherein the inorganic acid salt contained in the aqueous dispersion is an inorganic ammonium salt.

* * * * *